United States Patent
Ichikawa et al.

[11] Patent Number: 5,929,665
[45] Date of Patent: Jul. 27, 1999

[54] POWER CONVERTER WITH VOLTAGE DRIVE SWITCHING DEVICE MONITORED BY DEVICE PARAMETERS AND ELECTRIC PARAMETERS

[75] Inventors: Kosaku Ichikawa; Akio Hirata; Kazuto Kawakami; Kazuhiro Satoh, all of Tokyo, Japan

[73] Assignee: Kabushiki Kaisha Toshiba, Kawasaki, Japan

[21] Appl. No.: 09/042,576

[22] Filed: Mar. 17, 1998

[30] Foreign Application Priority Data

| Apr. 22, 1997 | [JP] | Japan | 9-104086 |
| May 27, 1997 | [JP] | Japan | 9-136297 |
| Jun. 2, 1997 | [JP] | Japan | 9-142869 |
| Jun. 11, 1997 | [JP] | Japan | 9-153158 |

[51] Int. Cl.⁶ ..................... H02M 3/06
[52] U.S. Cl. ............. 327/109; 363/98
[58] Field of Search ............ 327/109, 108, 327/538, 540, 541, 543; 323/350; 363/98, 18

[56] References Cited

U.S. PATENT DOCUMENTS

| 4,597,038 | 6/1986 | Stacey | 363/56 |
| 5,404,052 | 4/1995 | Lange | 327/109 |
| 5,610,507 | 3/1997 | Brittan | 323/350 |
| 5,621,257 | 4/1997 | Kawakami | 307/125 |
| 5,625,312 | 4/1997 | Kawakami et al. | 327/483 |

FOREIGN PATENT DOCUMENTS

| 7-067317 | 3/1995 | Japan |
| 7-264028 | 10/1995 | Japan |

*Primary Examiner*—Shawn Riley
*Attorney, Agent, or Firm*—Oblon, Spivak, McClelland, Maier & Neustadt, P. C.

[57] ABSTRACT

A power converter having at least a pair of voltage drive switching elements, which comprises a gate control circuit, the gate control circuit comprising a detecting section for detecting at least one of a set of device parameters and a set of electric parameters of the voltage drive switching elements, a monitoring section for monitoring at least one of states of turn-on and turn-off of the voltage drive switching elements based on the at least one of a set of device parameters and a set of electric parameters of the voltage drive switching elements detected by the detecting section, and a control section for controlling a gate of the voltage drive switching elements based on a monitoring result of the monitoring section.

19 Claims, 17 Drawing Sheets

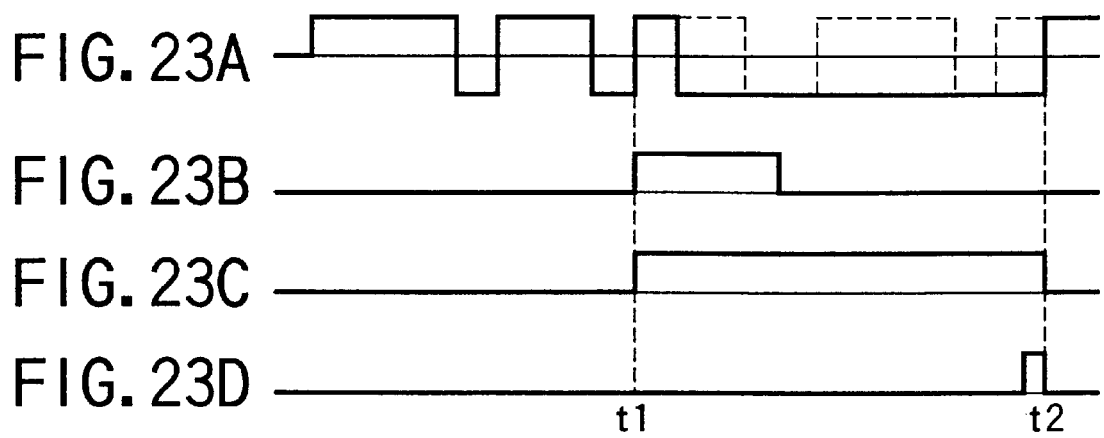
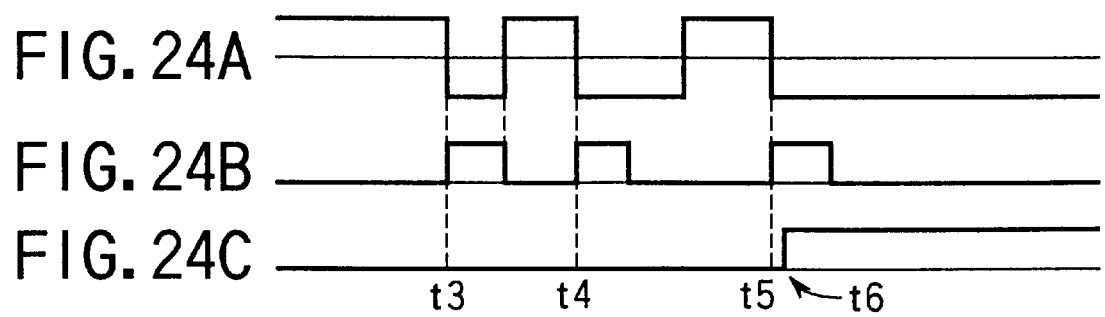

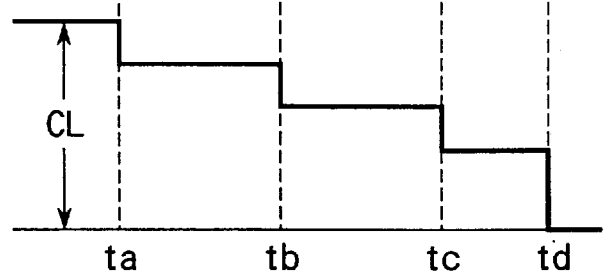
FIG. 28A
FIG. 28B
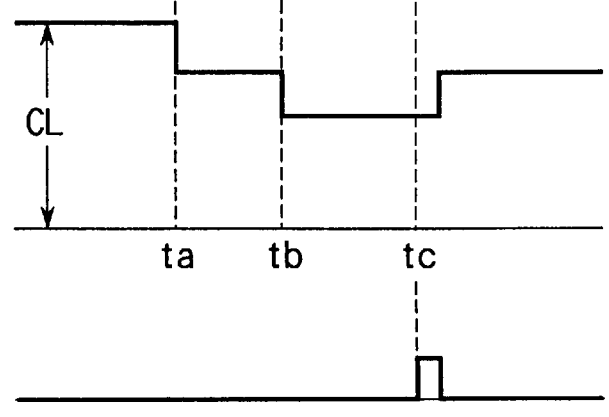
FIG. 29A
FIG. 29B
FIG. 29C

POWER CONVERTER WITH VOLTAGE DRIVE SWITCHING DEVICE MONITORED BY DEVICE PARAMETERS AND ELECTRIC PARAMETERS

BACKGROUND OF THE INVENTION

The present invention relates to a power converter with an insulated gate semiconductor device of a MOS gate structure, for example MOS-FET, IGBT (Insulated Gate Bipolar Transistor), IEGT (Injection Enhanced Gate Transistor) as a voltage drive switching element.

There is available a voltage drive switching element as a switching element used in a power converter, for example an inverter which drives an induction motor converting a direct current power to an alternating current power other than a current drive switching element such as a thyristor, a gate turn-off thyristor (GTO) or transistor. As typical examples of a voltage drive switching element, there are named: an insulated gate semiconductor device of a MOS gate structure, for example MOS-FET, IGBT (Insulated Gate Bipolar Transistor), IEGT (Injection Enhanced Gate Transistor).

FIG. 1 shows a gate drive circuit of IGBT in a conventional power converter. In FIG. 1, if a switching command $v_{in}$ for placing IGBT 7 in the conductive state (on) or non-conductive state (off), a gate voltage $v_{ge}$ corresponding to the switching command $v_{in}$ is applied between the gate and emitter of the IGBT 7 through transistors 3, 4 and a gate resistor 6. Thereby a switching operation such as turn-on or turn-off is performed in the IGBT 7. That is, if a positive switching command $v_{in}$ is input from a gate control circuit not shown as shown in FIG. 2, the transistor 3 is placed in the on state and the transistor 4 is placed in the off state, the output voltage $v_g$ becomes a positive voltage and a gate voltage $v_{ge}$ which is given through a gate resistor 6 is biased to the positive side to turn on the IGBT 7. If the switching command $v_{in}$ is negative, the transistor 3 is placed in the off state, the transistor 4 is placed in the on state, the gate voltage $v_g$ becomes a negative voltage and the gate voltage is biased to the negative side to turn off the IGBT 7.

A gate power supply for a forward bias (voltage $E_p$) 1 and a gate power supply for a negative bias (voltage $E_n$) 2 are respectively connected to the transistors 3, 4 through a limiting resistor 5. In this case, the limiting resistor 5 is connected between the gate power supply 2 and the transistor 4 or to both of them.

IGBT has equivalent capacitances $C_{ge}$ 8, $C_{cg}$ 9, $C_{ce}$ 10 and the like among the gate, emitter and collector terminals as shown in FIG. 3. For this reason, a short state arises between the collector and emitter in a high frequency condition. $C_{cg}+C_{ge}$ is present as an input capacitance $C_{ies}$ between the gate and emitter of the IGBT. Therefore, in order to make IGBT effect a switching operation, it is required charge and discharge in the input capacitance $C_{ies}$ through a gate resistor 6.

In a conventional gate drive circuit shown in FIG. 1, there arises a delay in time constant ($R6 \cdot C_{ies}$) which is determined by the gate resistor 6 and the input capacitance $C_{ies}$, which sometimes causes a trouble in the switching operation of the IGBT.

In order to make such a delay in time constant smaller, it is considered that a value of a gate resistance is made to be smaller or a voltage En of the gate power supply 2 which gives a negative bias is made to be higher.

However, when a value of the gate resistance 6 is made to smaller, a turn-off speed of the IGBT 7 becomes larger and a surge voltage becomes higher and thus the IGBT has a risk to have a damage by an overvoltage. When a voltage En of the gate power supply 2 is biased higher, a similar problem happens as well.

A current drive switching element and a voltage switching element will be considered as a switching element used in a power converter.

A turn-off characteristic of a current drive switching element, such as GTO in general is that when a load current is smaller, a turn-off time is shorter but when the load current is larger, the turn-off time is longer due to an influence of an accumulated charge in a semiconductor element as shown in FIG. 4. Therefore, in a power converter such as an inverter in which a current drive switching element is used, an on-gate supply inhibiting time (which is called as a dead time) to respective semiconductor elements of the positive and negative arms is relatively taken long and longer than the maximum turn-off time in consideration of the maximum turn-off time when the maximum current of the element is turned off and thereby short-circuit between the positive and negative arms (direct current short) is prevented.

On the other hand, it has actually observed that a turn-off characteristic of a voltage drive switching element such as an insulted gate switching element is an absolutely inverse characteristic to that of a current drive semiconductor switching element as shown in FIG. 5, that is a characteristic when a load current is larger, a turn-off time is shorter, but when the load current is smaller, the turn-off time is longer.

The reason why is that, as shown in FIG. 6, since a capacitance of a gate is larger when a voltage between a collector and emitter is smaller (such as in the on state of the device), but a capacitance of a gate is smaller (largely changed with two orders in magnitude) when a voltage between a collector and emitter is larger, charge to a gate capacitance from the collector side is slowed if a load current is very small.

For this reason, in an insulated gate switching element, it is only required in order to prevent short-circuit (direct current short-circuit) between the positive and negative arms that a dead time for the positive and negative arms is set longer in consideration of a turn-off time when a very small current of the element is turned off. However, in that case, a feature of an insulated gate switching element having a high speed switching characteristic cannot be utilized. While a higher switching frequency is desired in order to make a load current assume a sine wave form, perfect as much as possible in the case of PWM inverter and the like, the upper limit of frequency is restricted due to the restriction on the dead time.

BRIEF SUMMARY OF THE INVENTION

It is an object to provide a power converter having a gate drive circuit effecting turn-off control of a voltage drive switching element in a stable manner by reducing a delay of a gate voltage of the voltage drive switching element.

It is another object to provide a power converter having a gate drive circuit which can utilize a high frequency operation which a voltage drive switching element has and performs a switching operation in a stable manner in the range of a zero current to a rated load current.

It is a further object to provide a power converter using a voltage drive switching element, which realizes an operation with high reliability.

It is a still further object to provide a pressure-welded insulated-gate switching element which is preferably used as a voltage drive switching element applicable to a power converter.

The present invention discloses a device which follows the following principles in order to achieve the above mentioned objects.

A concept of the present invention is a power converter having at least a pair of voltage drive switching elements, which comprises a gate control circuit, the gate control circuit comprising:

detecting means for detecting at least one of a set of device parameters and a set of electric parameters of the voltage drive switching elements;

monitoring means for monitoring at least one of states of turn-on and turn-off of the voltage drive switching elements based on the at least one of a set of device parameters and a set of electric parameters of the voltage drive switching elements detected by the detecting means; and control means for controlling a gate of the voltage drive switching elements based on a monitoring result of the monitoring means.

A first principle of the present invention following the above mentioned concept has the above mentioned gate control circuit as a feature, the gate control circuit comprising:

deciding means for deciding completion of turn-off of the voltage drive switching elements based on a gate voltage of the voltage drive switching elements; and bias shift means for shifting a gate voltage of the voltage drive switching elements to the negative side when the deciding means decides completion of turn-off of the voltage drive switching elements.

A second principle of the present invention following the above mentioned concept has the above mentioned gate control circuit as a feature, the gate control circuit comprising:

detecting means for detecting a current flowing in the pair of voltage drive switching elements; and control means for controlling so as to decrease a dead time till an on-gate signal is supplied to one voltage drive switching element of the pair of voltage drive switching elements and the other thereof after the other voltage drive switching element is turned off when a detected current detected by the detecting means is larger than a predetermined value or to increase the dead time till an on-gate signal is supplied to the one voltage drive switching element of the pair of voltage drive switching after the other voltage drive switching element is turned off when the detected current is smaller than the predetermined value.

A third principle of the present invention following the above mentioned concept has the gate control circuit as a feature, the gate control circuit further comprising:

self protecting means for performing a protecting operation associated with a current flowing in a voltage drive switching element;

self holding means for holding the protecting operation when the self protecting means is activated; and reset means for resetting holding of a protecting operation by the self holding means based on an external signal.

A fourth principle of the present invention following the above mentioned concept has the voltage drive switching element as a feature, the voltage drive switching element comprising:

an electrode pressure-welded to a voltage derive switching element; and an inductance element formed in the shape having features of a cylinder and a spiral, which is provided between an end of the voltage drive switching element and the electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 23A to 23D are operation wave forms showing operations of self-protecting means and self-holding means shown in FIG. 22;

FIGS. 24A to 24C are operation wave forms showing operations of self-protecting means and self-holding means shown in FIG. 22;

FIGS. 28A and 28B are a table and a graph showing a relation between an operation of self-holding means and current restriction of power converter of a fourteenth embodiment of the present invention;

FIGS. 29A to 29C are a table and graphs showing a relation between an operation of self-holding means current restriction of power converter of a fifteenth embodiment of the present invention;

DETAILED DESCRIPTION OF THE INVENTION

A concept of the present invention is that at least one of the turn-on and turn-off states of voltage drive switching elements is monitored based on at least one of a set of device parameters and a set of electric parameters of a voltage drive switching element, and a gate of the voltage drive switching elements is controlled based on the monitoring results. Herein, the device parameters and electric parameters are those associated with a device, a gate, a emitter and a collector of the element.

A first principle of the present invention following the concept is that completion of turn-off of a voltage drive switching element is decided based on a gate voltage of the voltage drive switching element and the gate voltage of the voltage drive switching element is shifted to the negative bias side when it is decided that turn-off is completed.

Thereby, a delay of the gate voltage of the voltage drive switching element is reduced and turn-off control of the voltage drive switching element can be performed in a stable manner.

Figure 1:
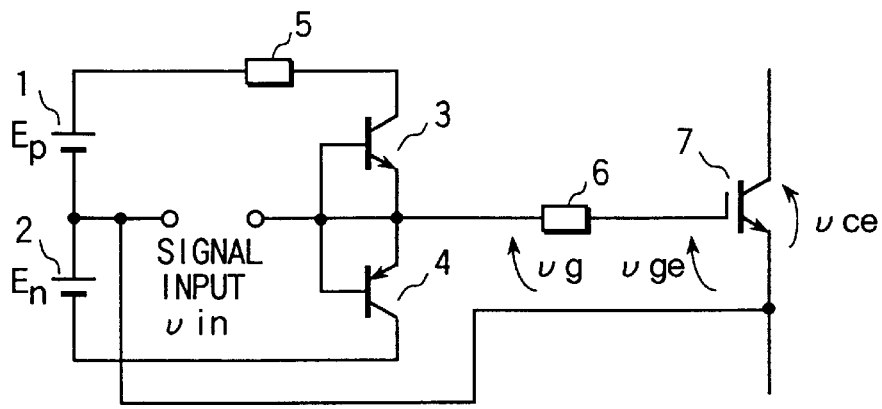
FIG. 1 is a diagram showing a structure of a conventional power converter.
Figure 2:
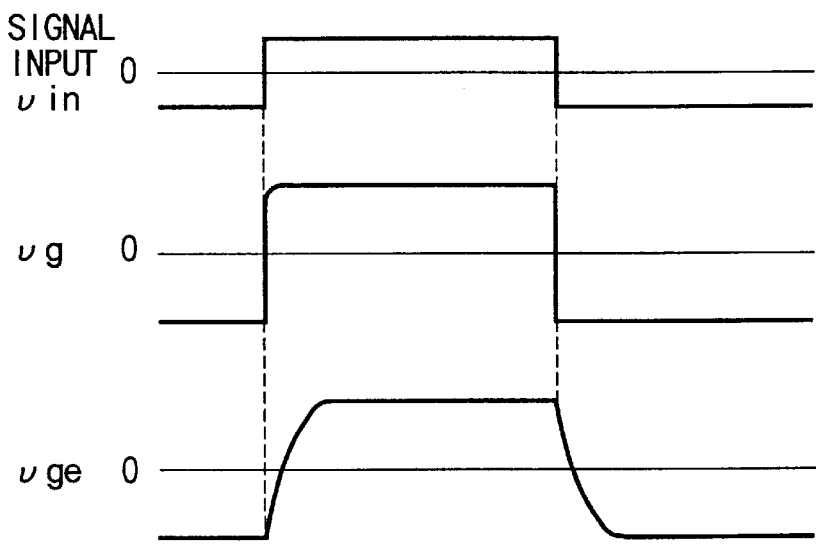
FIG. 2 is a wave form diagram for illustrating operations of a conventional power converter.
Figure 3:
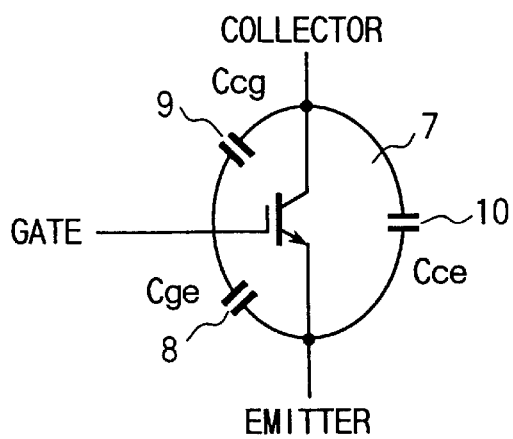
FIG. 3 is a diagram showing equivalent capacitances of IGBT.
Figure 4:
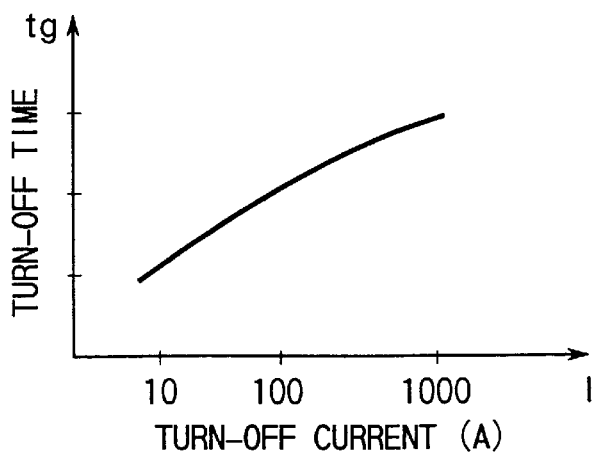
FIG. 4 is a graph showing a turn-off characteristic of GTO.
Figure 5:
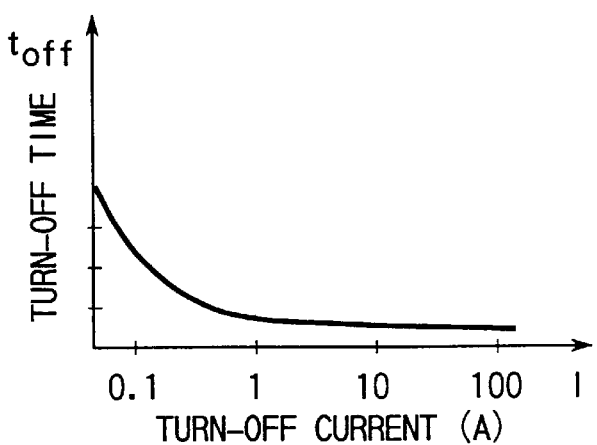
FIG. 5 is a graph showing a turn-off characteristic of a voltage drive semiconductor element.
Figure 6:
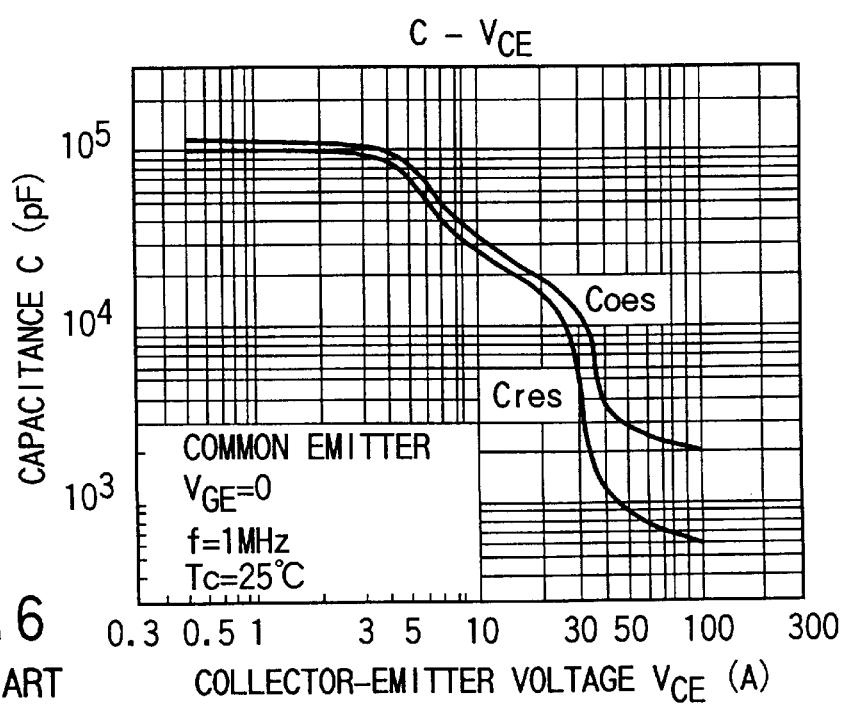
FIG. 6 is a graph illustrating a capacitance and a voltage of the voltage drive semiconductor element shown in FIG. 5.
Figure 7:
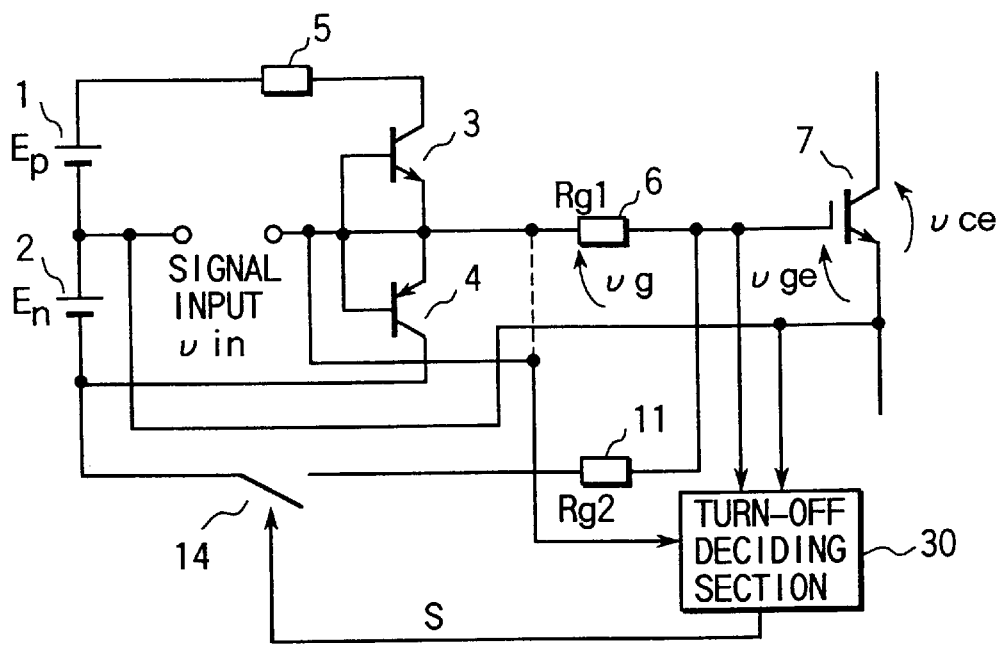
FIG. 7 is a diagram showing a structure of a first preferred embodiment of the present invention.

A first preferred embodiment following the first principle of the present invention will be described in reference to FIG. 7. As shown in FIG. 7, in a gate drive circuit of a power converter of the embodiment, a second gate resistor 11 is connected between the gate of IGBT 11 of a switching element of the power converter through a switch 14. The switch 14 is operated into the ON or OFF states based on a decision signal S and a negative voltage ($-E_n$) is applied to the second gate resistor 11 by the OFF state of the switch 14. A decision signal S given to the switch 14 is supplied from a turn-off deciding section 30 which decides completion of turn-off of IGBT 7 based on a voltage $v_{ge}$ between the gate and emitter of the IGBT 7. The other constituents are the same as those of the conventional circuit of FIG. 1 and the same marks are given.

In the above mentioned structure, if a switching command $v_{in}$ of a positive or negative voltage is input from a gate control circuit not shown, the same switching operation as done conventionally is conducted. That is, if a switching command $v_{in}$ of a positive or negative voltage is given, a voltage $v_g$ corresponding to the switching command $v_{in}$ is output through a transistor 3 or 4, a gate voltage, positive or negative, is applied between the gate and emitter of the IGBT 7 through a gate resistor 6. Thereby, the IGBT 7 is turned on or off. The switching operation is the same as done conventionally.

Figure 8:
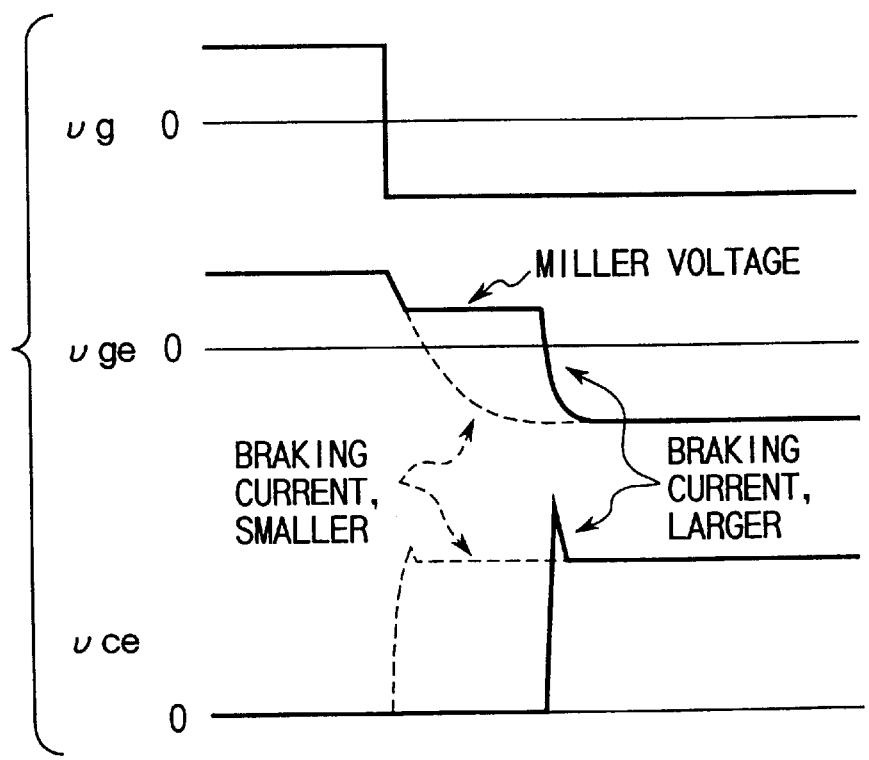
FIG. 8 is a diagram showing a wave form for illustrating operations of the first embodiment of the present invention in FIG. 7.

In this case, if a switching command $v_{in}$ of a negative voltage is input, the transistor 4 becomes conductive and a voltage $v_g$ corresponding to a negative voltage of a gate power supply 2 is output, the IGBT 7 starts a turn-off operation. At this point, a voltage $v_g$ between a gate and emitter is kept at a level called a Miller voltage (generally on the order of 5V) till a current flowing into a collector is changed to zero as shown in FIG. 8 by a turn-off characteristic of IGBT 7. When the current is zero, the voltage is rapidly transferred to a negatively biased state. In the turn-off, since a collector current is reduced at a predetermined current change rate di/dt, as a breaking current is larger, a generating time of a Miller voltage lasts longer and as a breaking current is smaller, a generating time of the Miller voltage lasts shorter as indicated by a dotted line.

When the gate voltage $v_{ge}$ is transferred to a negatively biased state, a decision signal S of completion of turn-off is output from a turn-off deciding section 30 and a switch 14 is in the conductive state and a negative voltage ($-E_n$ of the gate power supply 2 is supplied between the gate and emitter of the IGBT 7 in parallel through a second gate resistor 11.

Thereby, the gate voltage $v_{ge}$ is rapidly shifted and biased to the negative side. Therefore, a voltage between the collector and emitter of the IGBT 7 is rapidly raised and if a large dv/dt is applied, the IGBT 7 is not again ignited and can keep its turn-off state and thus the IGBT 7 can complete a turn-off operation in a stable manner.

Figure 9:
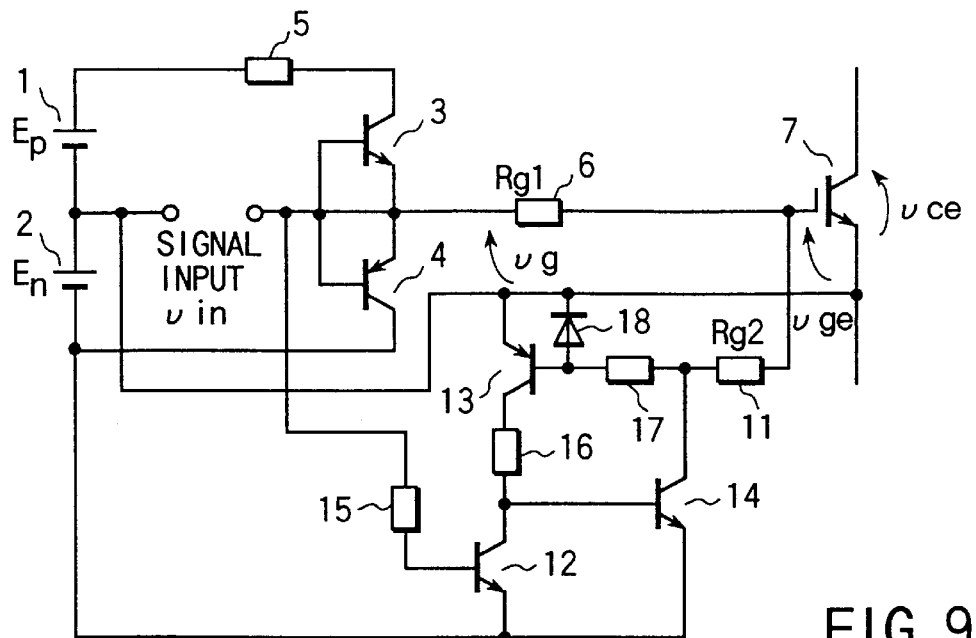
FIG. 9 is a diagram showing a structure of a second embodiment of the present invention.

FIG. 9 shows a second embodiment of a gate drive circuit of the present invention in a concrete manner. The gate drive circuit comprises: as shown in FIG. 9, transistors 12, 13, 14, resistors 15, 16, 17 and a diode 18. The other constituents are the same as the conventional circuit in FIG. 1 and the same marks are used.

In the structure of FIG. 9, if a switching command $v_{in}$ of a negative voltage is input from a gate control circuit not shown, a transistor 3 is placed in the off state, a transistor 4 is placed in the on state, a voltage of $-En$ is input to a gate resistor 6, a transistor 12 is placed in the off state and transistors 13 and 14 are placed in the on state. Thereby a voltage of $-E_n$ is input to a second gate resistance 11 and a gate voltage $v_{ge}$ from the second gate resistor 11 is supplied to the IGBT 7 in parallel to a gate voltage $v_{ge}$ supplied from the gate resistor 6.

In this situation, when the switching command $v_{in}$ is changed to a positive voltage, the transistor 4 is placed in the off state but the transistor 3 is placed in the on state and an input voltage $v_g$ of the gate resistor 6 is from $-E_n$ to $+E_p$. At the same time, the transistor 12 is change to be placed in the on state from the previous off state and the transistor 14 is placed in the off state and an input voltage of the second gate resistor 11 is changed from $-E_n$ to a zero voltage and thus a reference gate voltage $v_{ge}$ is started to change in a positive direction at a change rate of time constant (R6·$C_{ies}$).

At the time point when the gate voltage $v_{ge}$ is changed from the negative side to positive side, the transistor 13 is placed in the off state and a gate voltage $v_{ge}$ is increased, so that the IGBT is controlled to be in a turn-on state.

Thereafter, when a switching command $v_{in}$ is changed from a positive voltage to a negative voltage in a condition in which a current flows in the collector of the IGBT 7, a transistor 3 is placed in the off state and the transistor 4 is placed in the on state. Thereby, a voltage of $-E_n$ is input to a gate resistor 6 and at the same time a transistor 12 enters the off state.

Figure 10:
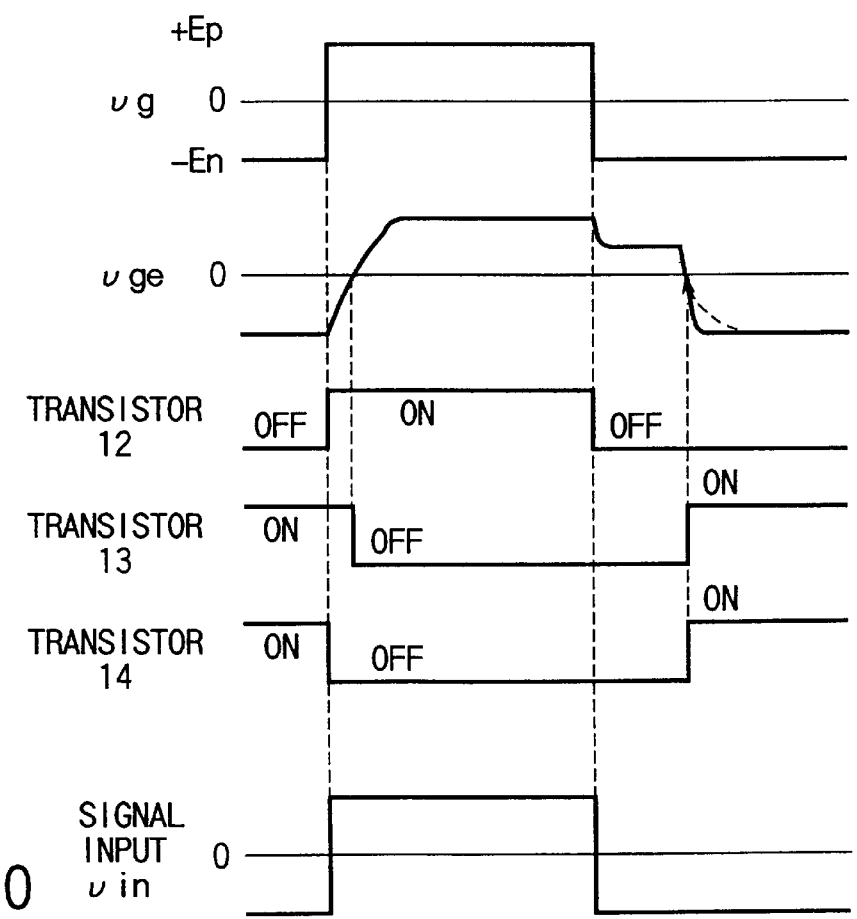
FIG. 10 is a diagram showing a wave form for illustrating operations of the second embodiment of the present invention in FIG. 9.

However, when a current flows in the collector of the IGBT 7, as shown in FIG. 10, a voltage $v_{ge}$ between the gate and emitter does not immediately change to a negative voltage but is kept at a Miller voltage as mentioned above. For this reason, the transistor 13 is not immediately transited to the on state but a base current does not flow in the transistor 14 and the transistor 14 is kept in the off state even if the transistor 12 is in the off state.

Therefore, the IGBT 7 is subjected to turn-off control only by the gate voltage $v_{ge}$ supplied from the gate resistor 6. When the collector current is reduced to zero and the Miller voltage disappears and a gate emitter voltage $v_{ge}$ is negative, the transistor 13 is placed in the on state and the transistor 14 is also placed in the on state and a voltage input to the second gate resistor 11 changes from a zero voltage to $-E_n$. Thereby, a negative gate voltage $v_{ge}$ is in parallel supplied to the IGBT 7 from the gate resistor 6 and the second gate resistor 11.

Therefore, according to the embodiment, after the IGBT 7 completes a turn-off operation, the gate voltage $v_{gr}$ is rapidly biased to the negative side at a time constant $[C_{ge}·(R_{g1}·R_{g2})/(R_{g1}+R_{g2})]$ shorter than an conventional example (FIG. 1) indicated by a dotted line. Thereby, a second ignition by a collector-emitter voltage dv/dt of the IGBT 7 can be prevented from occurring.

In the embodiment, since completion of turn-off of the IGBT 7 is detected and thereby the gate voltage is controlled, a change in characteristic by a breaking current or a dispersion by difference between devices do not affect the effect.

Figure 11:
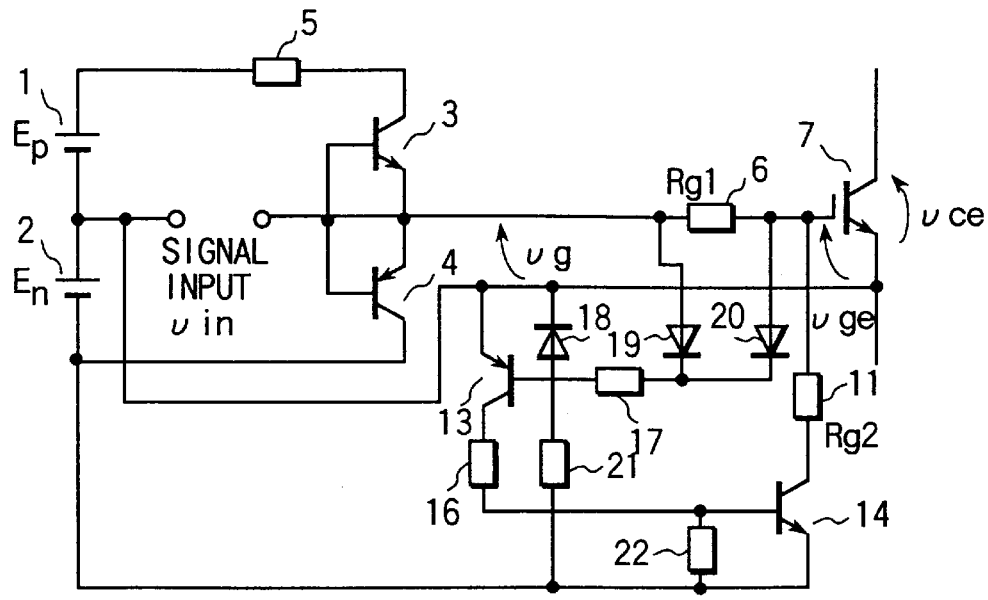
FIG. 11 is a diagram showing a structure of a third embodiment of the present invention.

FIG. 11 shows a third embodiment of a gate drive circuit. In FIG. 11, a gate drive circuit of the embodiment further comprises: diodes 19, 20 and resistors 21, 22 in addition to those included in FIGS. 9 and 1.

In the embodiment, the transistor 13 is brought in the on or off state by a voltage $v_{ge}$ on the output side or a voltage on the input side of the gate resistor 6, whichever is higher. In the structure of FIG. 11, if a switching command $v_{in}$ of a negative voltage is input from a gate control circuit not shown, the transistor 3 is placed in the off state and the transistor 4 is placed in the on state. Thereby, a voltage of $-E_n$ is input to the gate resistor 6 and the transistors 13, 14 are both placed in the on state and a voltage of $-E_n$ is input to the second gate resistor 11. A negative gate voltage $v_{ge}$ is supplied in parallel to the IGBT 7.

When the switching command $v_{in}$ changes to a positive voltage from this situation, the transistor 4 enters the off state but the transistor 3 enters the on state. In company with this, an input voltage $v_g$ of the gate resistor 6 changes from $-E_n$ to $+E_p$. At the same time, the transistor 13 changes its state from on to off and the transistor 14 enters the off state and as a result an input side of the second gate resistor 11 assumes the open state. Thereby, The gate voltage $v_{ge}$ increases in the positive direction at a change rate of a time constant (R6·$C_{ies}$) and the IGBT 7 is controlled to be in a turn-on state shown in FIG. 12.

Thereafter, when the switching command $v_{in}$ changes to a negative voltage in a condition in which a current flows in the collector of the IGBT 7, the transistor 3 is again placed in the off state, the transistor 4 is placed in the on state and a voltage of $-E_n$ is input to the gate resistor 6.

Figure 12:
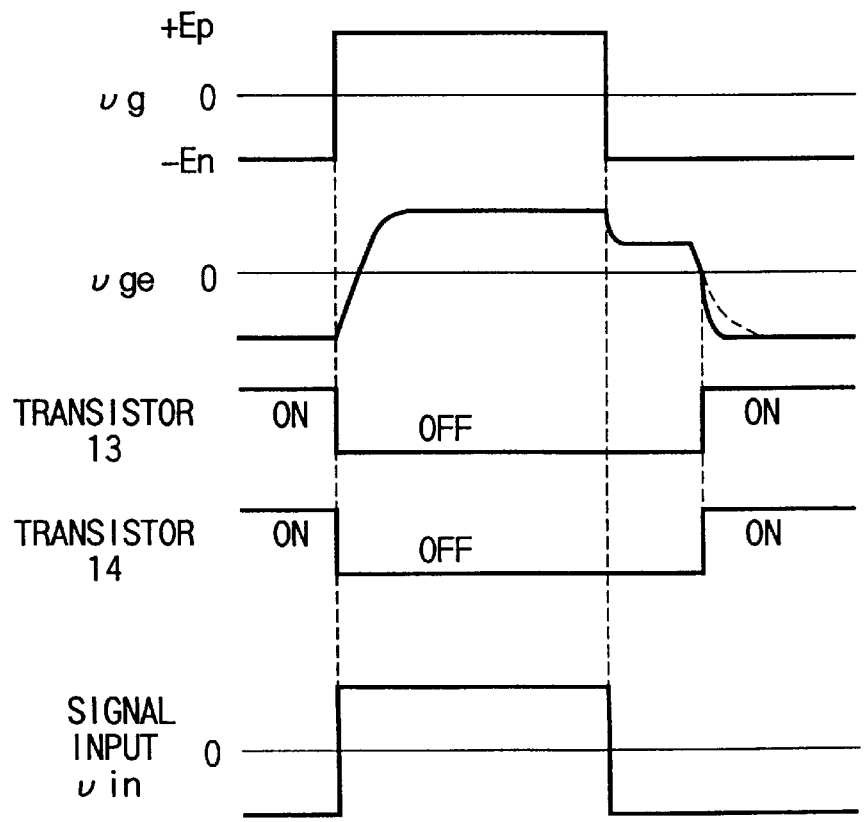
FIG. 12 is a diagram showing a wave form for illustrating operations of the third embodiment of the present invention in FIG. 11.

However, since if a current flows in the collector of the IGBT 7, a gate-emitter voltage $v_{ge}$ is not immediately changed to a negative voltage but kept at a Miller voltage, the transistor 13 does not immediately enter the on state and the off state of the transistor 14 is kept as shown in FIG. 12.

Therefore, the IGBT 7 is subject to turn-off control only by the gate voltage $v_{ge}$ supplied from the gate resistor 6. When a collector current is changed to zero and the miller voltage disappears and the gate voltage $v_{ge}$ changes to be negative, the transistor 13 is brought in the on state and the transistor 14 also obtains the on state. Thereby, a voltage input to the second gate resistor 11 changes from zero to $-E_n$ and thus a negative gate voltage $v_{ge}$ is supplied to the IGBT 7 from the gate resistor 6 and the second gate resistor 11 in a parallel manner.

As can be seen from the above description, according to the present invention, after the IGBT completes a turn-off operation, the gate voltage $v_{ge}$ is rapidly shifted and biased to the negative side in a similar way to that in the already mentioned embodiments and thereby a second ignition of the IGBT 7 by increase of dv/dt of a collector-emitter voltage can be prevented from occurrence.

Figure 13:
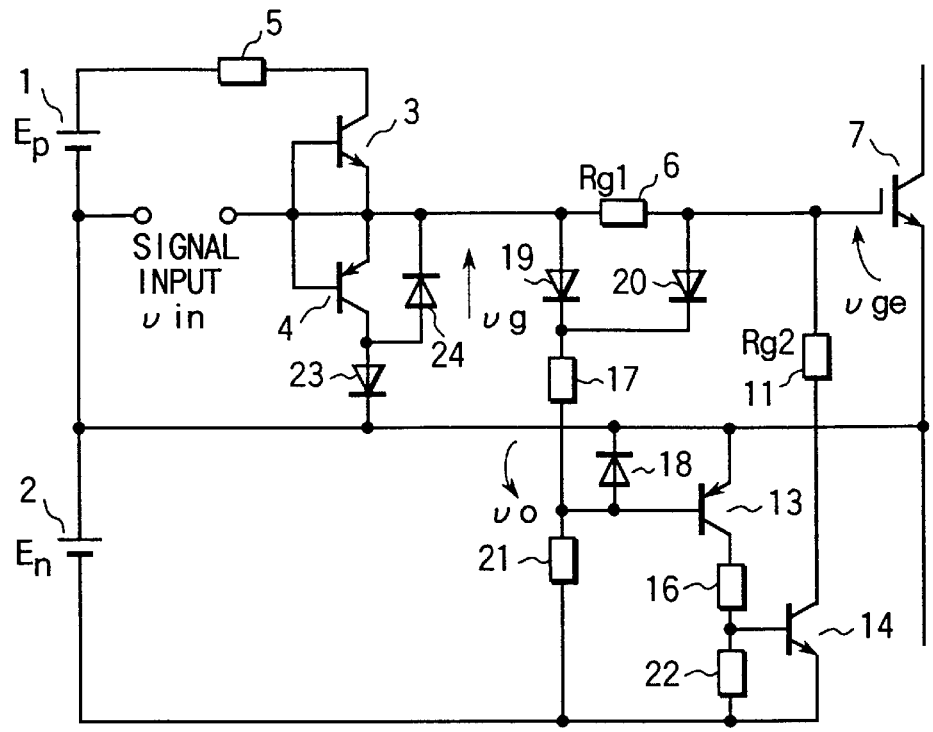
FIG. 13 is a diagram showing a structure of a fourth embodiment of the present invention.

FIG. 13 shows a fourth embodiment of a gate drive circuit of the present invention in a concrete manner. A gate drive circuit shown in FIG. 13 has a structure which comprises diodes 23, 24 in addition to the circuit shown in FIGS. 1 and 11.

In a gate drive circuit of the embodiment, when a switching command $v_{in}$ is given with a negative voltage, a input voltage $v_g$ of a gate resistor 6 is made to be a zero voltage to make the gate and emitter of the IGBT 7 short therebetween through the gate resistor 6.

Figure 14:
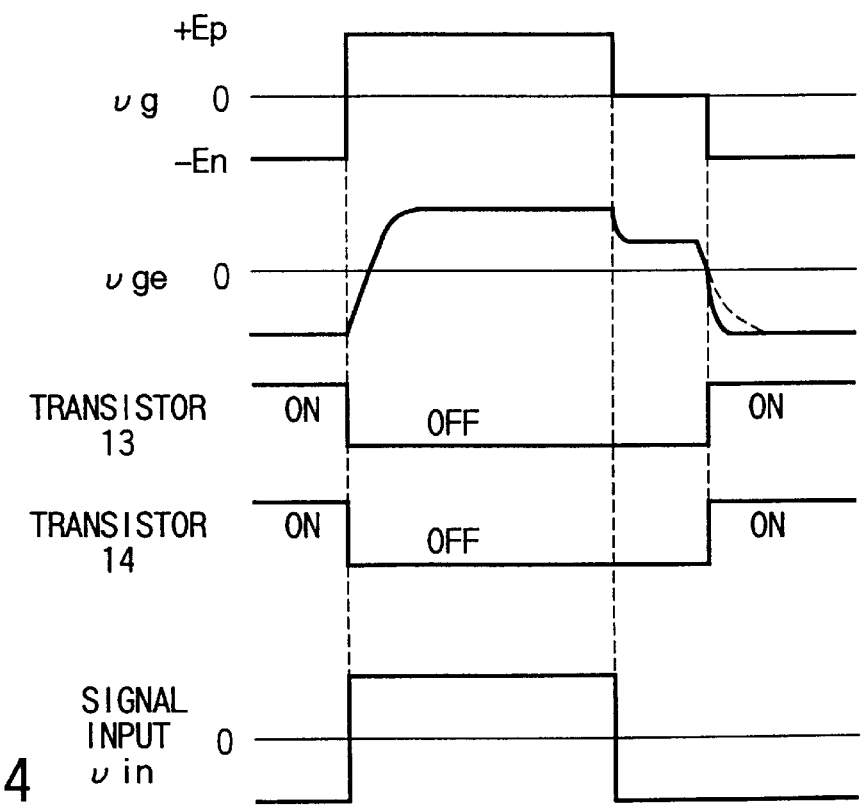
FIG. 14 is a diagram showing a wave form for illustrating operations of the fourth embodiment of the present invention in FIG. 13.

In the embodiment, if the switching command $v_{in}$ changes from a positive voltage to a negative voltage in a condition in which the IGBT 7 assumes the on state and a collector current flows, the IGBT 7 starts a turn-off operation. Thereby, the gate voltage $v_{ge}$ is kept at a Miller voltage, as described above. When the collector current becomes zero and the Miller voltage disappears, the gate voltage $v_{ge}$ is reduced to a negative voltage and a base voltage $v_o$ which is given to the transistor 13 through a diode 20 and a resistor 17 becomes negative. For this reason, as shown in FIG. 14, the transistor 13 assumes the on state and the transistor 14 also assumes the on state and a voltage of $-E_n$ is applied to the second gate resistor 11. Thereby, the gate voltage $v_{ge}$ is rapidly biased to the negative side and a second ignition of IGBT 7 by dv/dt of a collector.emitter voltage is prevented from occurrence.

According to the embodiment, since a turn-off operation of the IGBT 7 is made to perform in a relatively slow pace to control a surge voltage by di/dt and thereby the gate voltage $v_{ge}$ can be rapidly biased to the negative side from a time point when turn-off is completed, a second ignition of the IGBT 7 by dv/dt of a collector.emitter voltage can be prevented from occurrence.

The diode 24 is used to prevent application of an excessively large reverse voltage between the collector and emitter of the transistor 4.

As described above, according to the gate drive circuit of a voltage drive switching element of the present invention, since when the voltage drive switching element completes a turn-off operation, the gate voltage can rapidly be shifted to a negatively biased side and thereby an erratic ignition caused by dv/dt of a main circuit is prevented and switching control on on/off with stability and high reliability can be performed.

An embodiment following the second concept of the present invention will be described. The second concept of the present invention is that control is performed in such a manner that a current flows in a pair of voltage drive switching elements is detected, if the detected current is equal to or larger than a predetermined value, a dead time till an on-gate signal is supplied to one of the pair of voltage switching elements after the other of the pair of voltage drive switching elements is turned off is shorten and if the detected current is less than the predetermined value, a dead time till an on-gate signal is supplied to the one of the pair of voltage switching elements after the other of the pair of voltage drive switching elements is turned off is longer.

Thereby, a high frequency operation which a switching element has can be utilized and a switching operation from a zero current to a rated load current can be performed in a stable manner.

Figure 15:
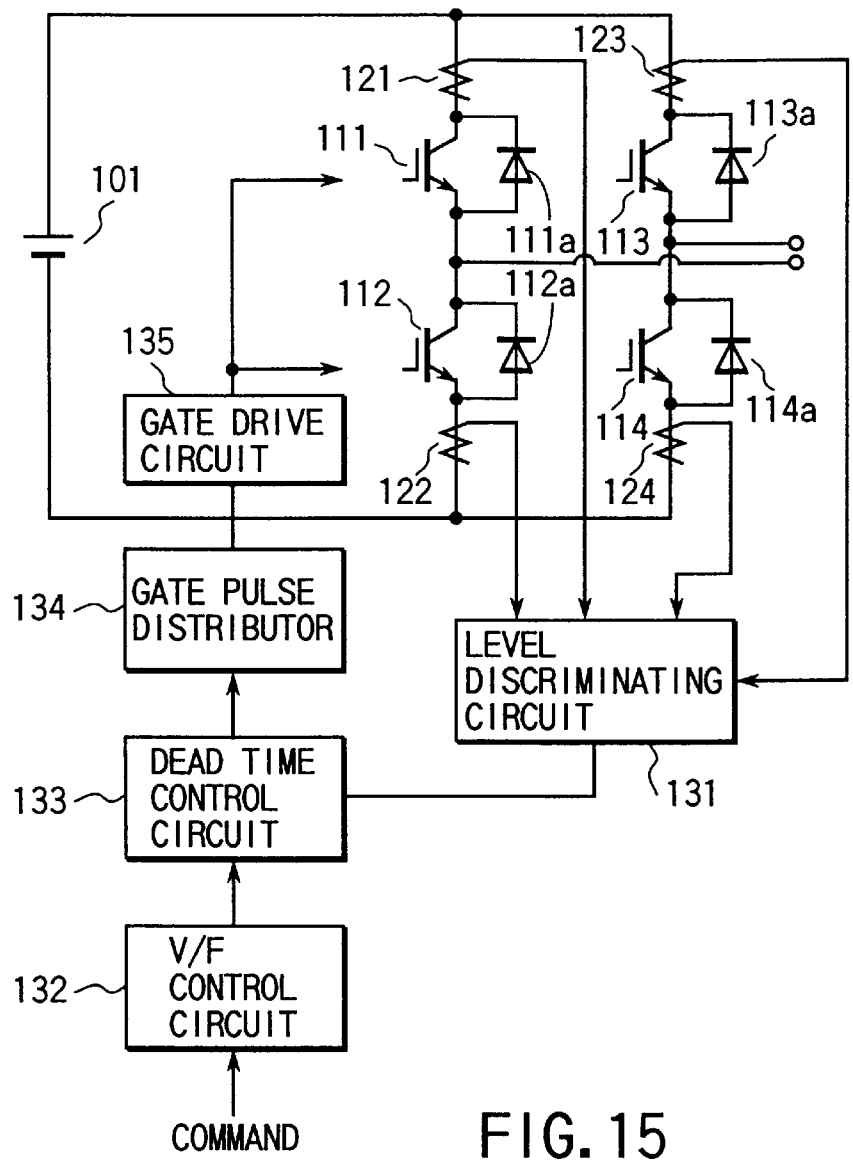
FIG. 15 is a block diagram showing an outline of a structure of a fifth embodiment of the present invention.

A fifth preferred embodiment following the second concept of the present invention will be described in reference to FIGS. 15, 16. As shown in FIG. 15, a main circuit of a power converter of the present invention comprises: a direct current power supply 101; insulated gate semiconductor elements in series connected therebetween 111 to 114, diodes 111*a* to 114*a* in inverse parallel connected to respective elements 111 to 114. The main circuit of the power converter can output a alternating power by arms of two sets or more of insulated gate semiconductor elements 111 to 114 and diodes 111*a* to 114*a* in reverse parallel connected to the devices, wherein one set of insulated gate elements 111 to 114 and diodes 111*a* to 114*a* are called one arm.

A control circuit of the power converter comprises: current transformers 121 to 124 provided for each arm; a level discriminating circuit 131 for discriminating an output level or a polarity of each current transformer; a control circuit, for example a voltage frequency (V/F) control circuit 132, for supplying an on or off signal to each of elements 111 to 114; a dead time control circuit 133; a gate pulse distributor 134; and a gate drive circuit 135.

The level discriminating circuit 131 discriminates an output level of the current transformers 121 to 124 provided to each arm. A dead time which is set in the dead time control circuit 133 is switched based on an output signal of the level discriminating circuit 131. That is, when an arm current is smaller than a predetermined value, a dead time is adjusted to be longer and when the arm current is larger than the predetermined value, the dead time is adjusted to be smaller.

Figure 16:
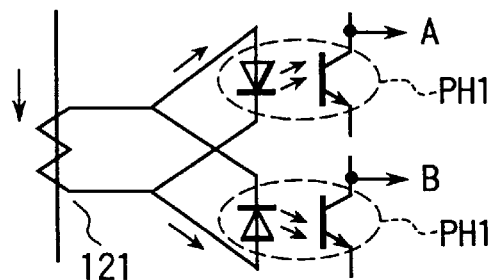
FIG. 16 is a circuit diagram showing a level discriminating circuit of the fifth embodiment shown in FIG. 15.

As shown in FIG. 16, in the level discriminating circuit 131, two photo-couplers PH1 are provided at the secondary side of a current transformer 121 provided for each arm in parallel with an inverse polarity and A and B signals are obtained based on whether a current flows in the positive or negative direction and an output level of the main circuit is discriminated by the A and B signals.

Figure 17:
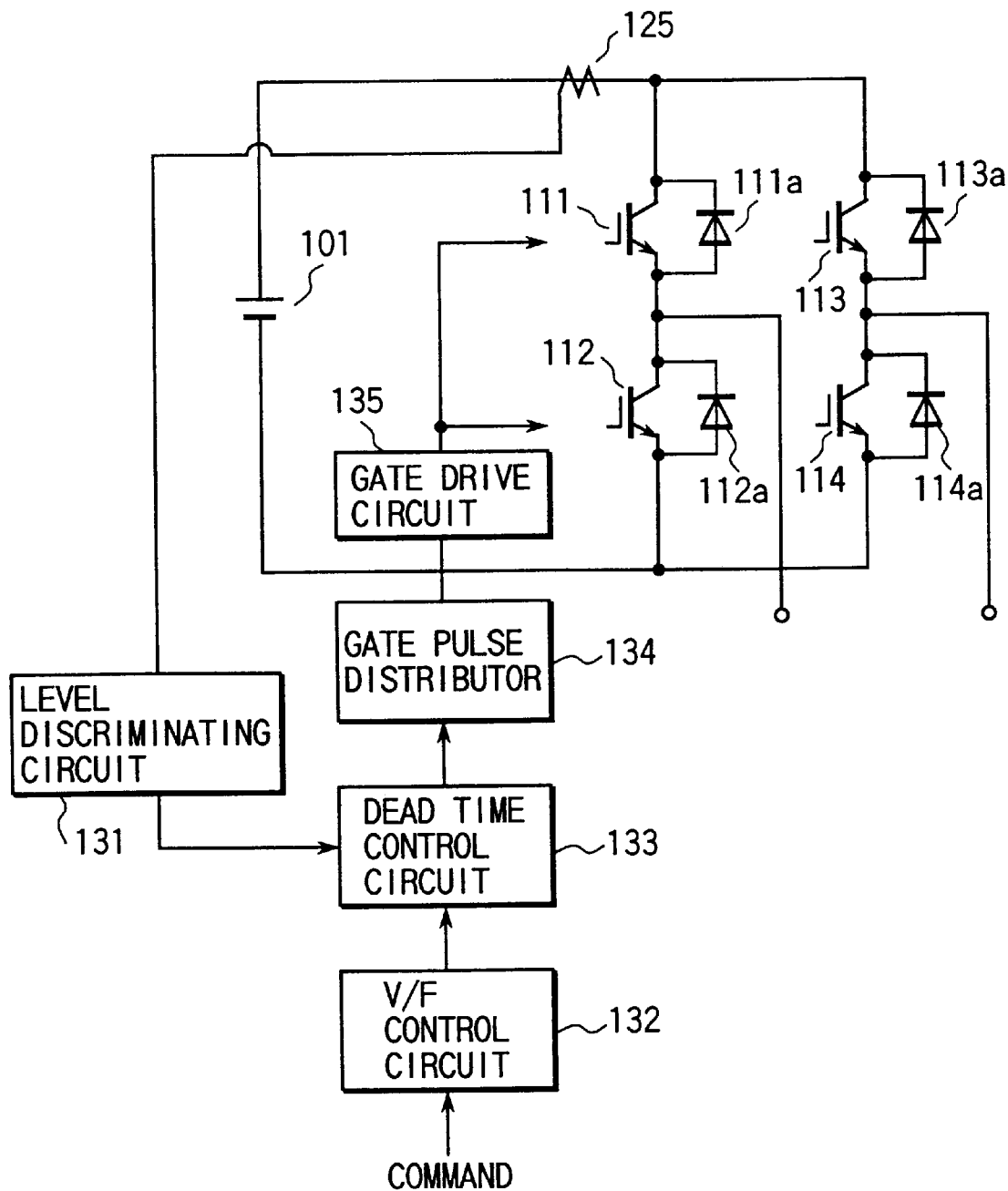
FIG. 17 is a block diagram showing a structure of a sixth embodiment of the present invention.

A sixth embodiment of the present invention is shown in FIG. 17. As shown in FIG. 17, a power converter comprises: a direct current power supply 101; insulated gate semiconductor elements 111 to 114; and diodes 111*a* to 114*a* in inverse parallel connected to respective elements 111 to 114. In the power converter, an alternating current output can be obtained using two arms or more of devices and diodes, wherein one arm comprises elements 111 to 114 and diodes 111*a* to 114*a* in combination.

A control circuit of the power converter comprises: a current transformer 125 for detecting a direct current; a level discriminating circuit 131 for discriminating an output level of the current tans former 125; a V/F control circuit 132 for supplying an on or off signal to each of the elements 111 to 114; a dead time control circuit 133; a gate distributor 134; and a gate drive circuit 135.

The level discriminating circuit 131 discriminates an output level of the current transformer 125 provided for detecting a direct current. A dead time which is set in the gate control circuit is switched based on an output signal of the level discriminating circuit 131. That is, when a direct current is smaller than a predetermined value, a dead time is adjusted to be longer and when the direct current is larger than the predetermined value, the dead time is adjusted to be smaller.

Figure 18:
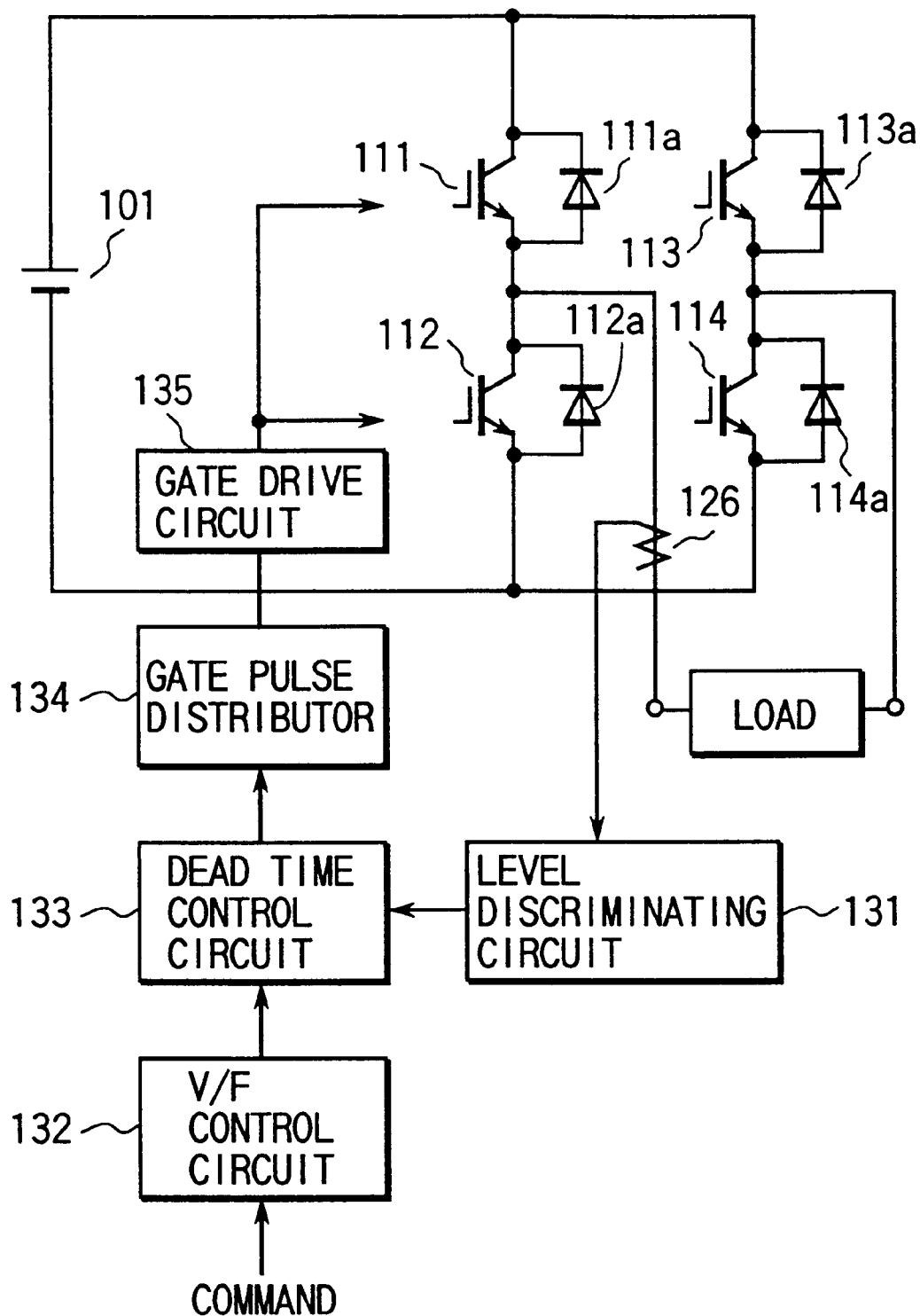
FIG. 18 is a block diagram showing a structure of a seventh embodiment of the present invention.

A seventh embodiment of the present invention will be described in reference to FIG. 18. In FIG. 18, the same marks as those in FIGS. 15, 16 indicate the same constituents and what is different from FIGS. 15, 16 is only to a current transformer 126 is provided in an output line. That is, a dead time which is set in the dead time control circuit 133 is switched based on an output signal of the level discriminating circuit 131. That is, it is controlled in such a manner that when a direct current is smaller than a predetermined value, a dead time is adjusted be longer and when the direct current is larger than the predetermined value, the dead time is adjusted to be smaller.

Figure 19:
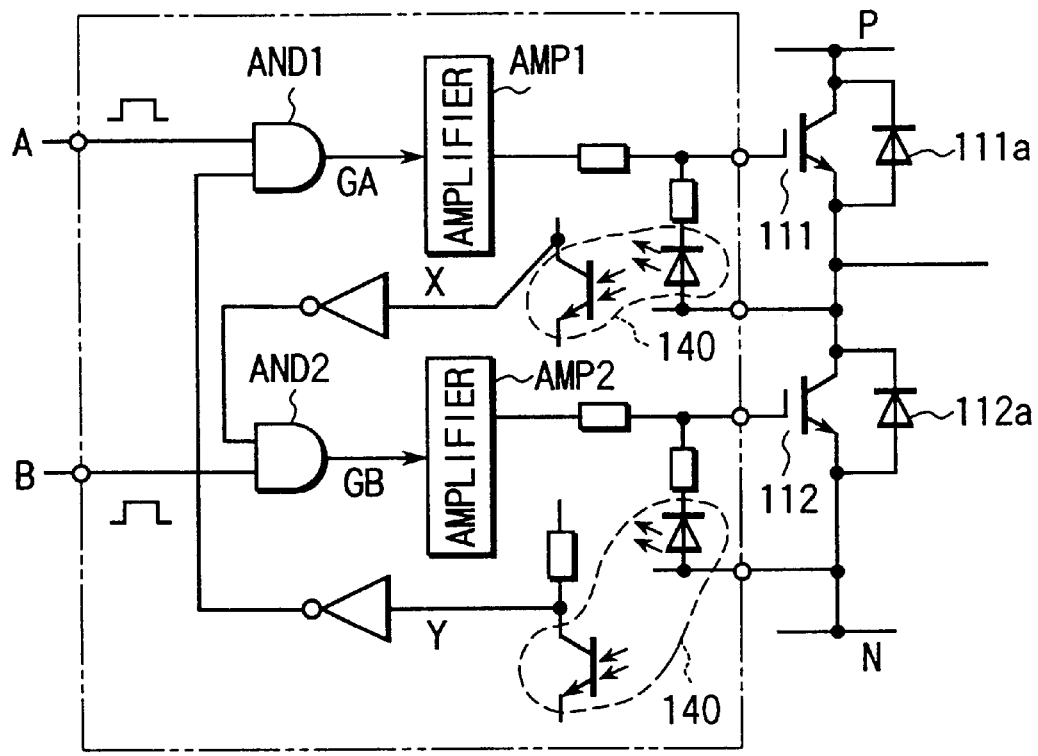
FIG. 19 is a diagram showing a structure of a eighth embodiment of the present invention.

An eighth embodiment of the present invention will be described in reference to FIG. 19. In FIG. 19, the same marks as those of FIGS. 15, 16 indicate the same constituents and only two arms of a current transformer are shown. In FIG. 19, an light emitting device 140, such as a photo-coupler as means for detecting a negative bias between the gate and emitter of elements 111, 112 is provided and it is detected based on the light detection signal that the elements 111, 112 have actually turned off. Gate signals GA, GB are supplied to the elements 111, 112 the pair of arms through AND circuits AND 1, AND 2 for obtaining a conjugation of the signals X, Y and gate signals A, B of a pair of arms, and amplifiers AMP1, AMP2.

Figure 20:
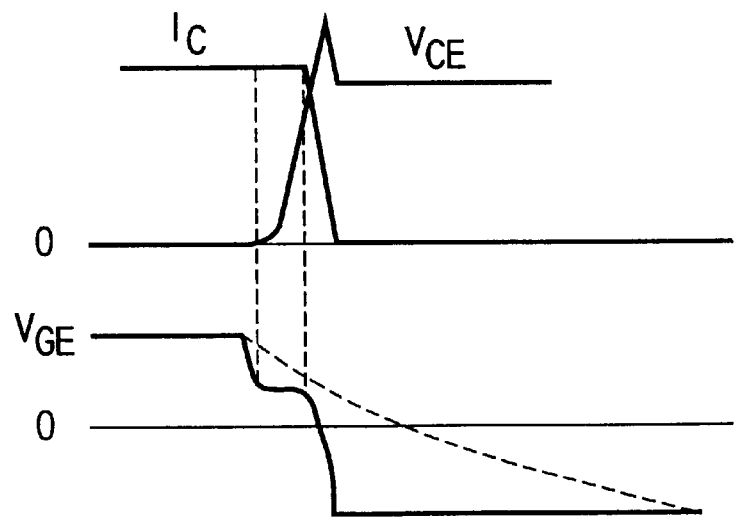
FIG. 20 is a diagram showing operations of the semiconductor element shown in FIG. 19.

FIG. 20 shows a collector voltage VCE and a collector current IC when a element is turned off, a collector current IC and a voltage between the gate and emitter VGE. When a relatively large current is cut off, a gate signal as in the shape of a wave depicted by a solid line is supplied and thereby a miller voltage is generated and immediately thereafter a negative voltage appears. On the other hand, it has been found that when a very small current is cut off, a wave form in the shape depicted by a dotted line which has a mild slope is supplied and thereby a turn-off time takes more than double.

In FIG. 19, since a negative bias voltage is generated between the gate and emitter as shown in FIG. 20 when a element is turned off and a current is zero, a current flows in a light emitting element 140 by the negative bias voltage. Thereby, it is detected that the element is turned off, a conjugation of the detected signal and an on-gate command of a pair of the element is obtained and a gate signal is output. Thereby, since it is prevented that negative and positive arms assume the on state at the same time, generation of direct current short-circuit can be prevented from occurrence even when a turn-of time of the device changes.

Figure 21:
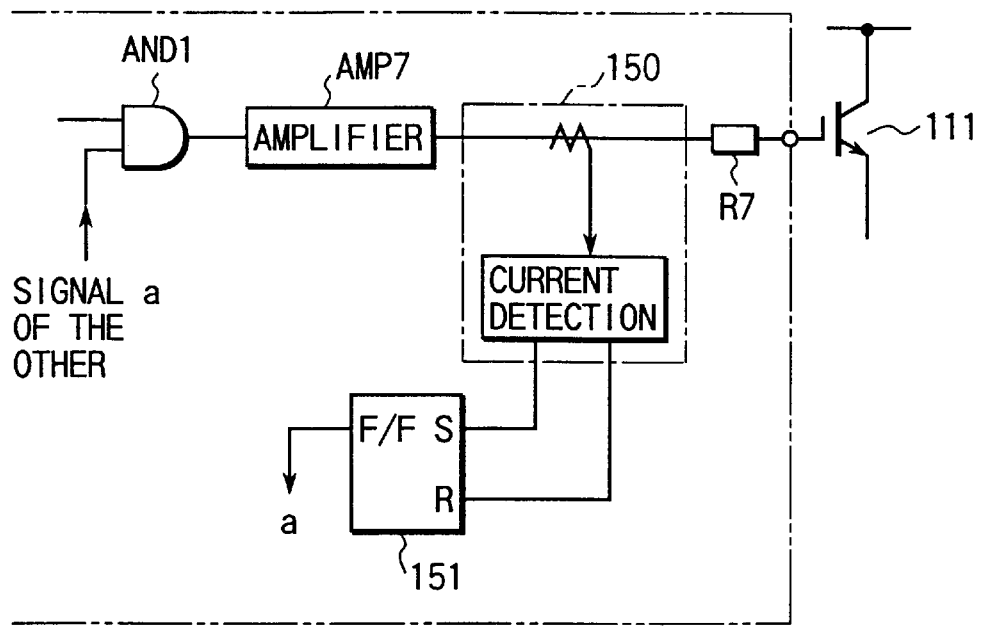
FIG. 21 is a block diagram showing a structure of a ninth embodiment of the present invention.

A ninth embodiment of the present invention will be described in reference to FIG. 21. That is, in FIG. 21, the same marks as those in FIG. 19 indicate the same constituents and a current detector 150 for detecting a negative gate current when the element is turned off and a flip-flop circuit 151 which is operated by the signal of the detector 150 are provided.

The current detector 150 detects a positive current while an off-gate current flows in one element 111 and thereby the current detector 150 gives a signal to the flip-flop circuit 150 so that an on-gate signal is not supplied to one element 111 the other element 112 of the pair. Thereby, the flip-flop circuit 151 is reset. On the other hand, the current detector 150 supplies a signal to the flip-flop circuit 151 in order to set the flip-flop circuit 151 when the current detector 150 detects a negative gate current. A signal a of the flip-flop circuit 151 corresponding to the one device 111 and a signal a of the flip-flop circuit 151 corresponding to the other element 112 of the pair are combined to generate a conjugation by an AND circuit AND1 and an output of the AND circuit AND1 is given to the device 111 as a gate signal GA through an amplifier AMP7 and a resistor 7.

In such a structure, since it can be prevented that positive and negative arms assume the on states at the same time using an output signal of the current detector 150 by the same operations as those in the above mentioned embodiments, generation of direct current short-circuit is prevented even when a turn-off time of the device changes.

As seen from the above description, according to the present invention, since detecting means for detecting a current flowing in a semiconductor device and its polarity is provided, it is controlled based on a result of the detecting means in such a manner that a dead time of positive and negative arms of the converter is adjusted to last longer when the detected current is smaller than a predetermined value or the dead time is adjusted to last shorter when the detected current is larger than the predetermined value, even though the semiconductor device has a turn-off characteristic which is peculiar to the device, that is, a turn-off time is shorter when a current is larger but the turn-off time is longer when the load current is smaller and thereby a high frequency operation of the semiconductor device can be utilized, so that there can be provided a power converter having a gate drive system which can be driven in a stable manner in the range of a zero current to a rated load current with high reliability.

A third principle of the present invention following the above mentioned concept will be described. The third principle is that a protecting operation is held when self protecting means for performing a protecting operation associated with a current flowing in a voltage drive switching element operates and holding of the protecting operation by the self protecting means is reset by an external signal.

Thereby, a power converter using a voltage drive switching element, which realizes an operation with high reliability can be provided.

An preferred tenth embodiment following the third principle of the present invention will be described in reference to FIG. 22. In the preferred embodiment following third principle, as a switching element of a power converter, IPM (Intelligent Power Module) having self protecting means is used.

Figure 22:
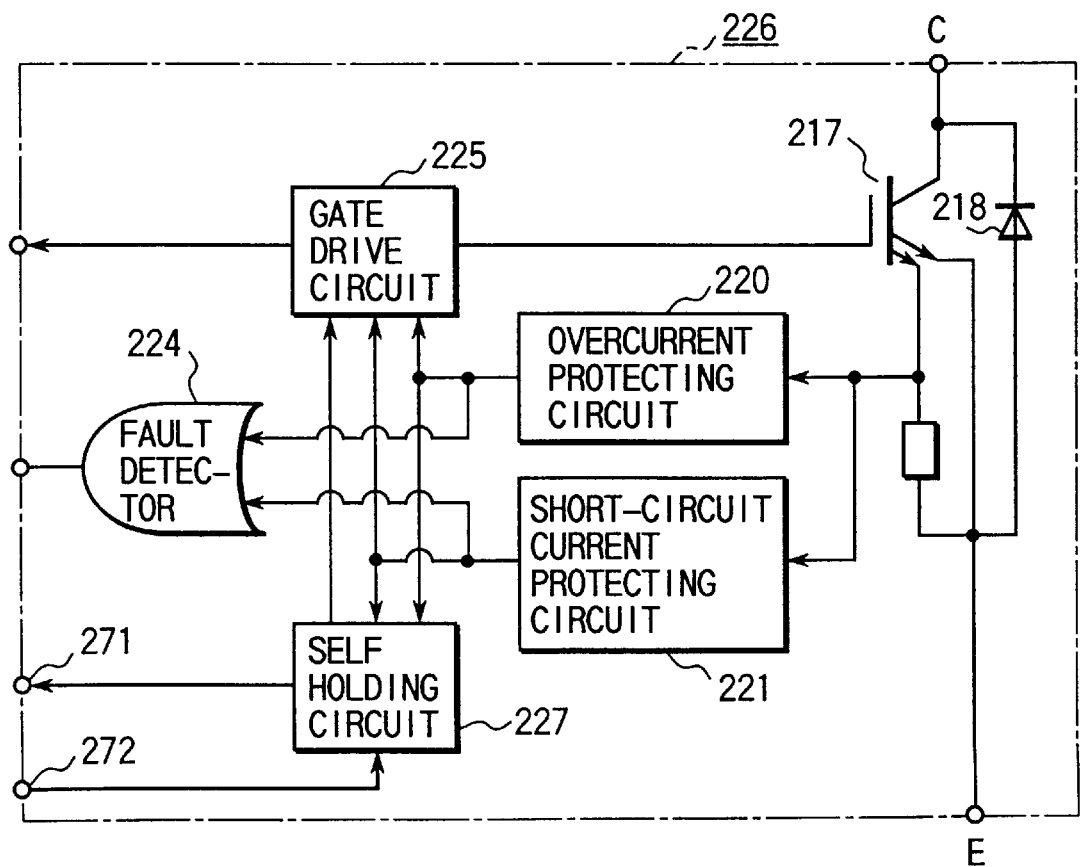
FIG. 22 is a block diagram showing an outline of a structure of a tenth embodiment of the present invention.

In FIG. 22, IPM 226 which is a switching element of the power converter comprises IGBT element 217 to which a diode 218 is inversely connected. A gate drive device 225 is connected to the gate of the IGBT element 217. IPM 226 comprises an overcurrent protecting circuit 220 for overcurrent protection of the IGBT element 217 and a short-circuit current protecting circuit 221 for short-circuit current protection. The IPM 226 receives outputs of the overcurrent protecting circuit 220 and the short-circuit current protecting circuit 221 and has a fault detector 214 for protecting fault detection of the IGBT element 217. In addition, the IPM comprises a self holding circuit 227, an output signal terminal 271 of the self holding circuit and a reset signal terminal 272 of the self holding circuit 227, which are characteristic part of the embodiment.

In such a structure, as a self protecting function of the IGBT element 217, there are provided the overcurrent protecting circuit 220 and the short-circuit current protecting circuit 221. When these circuits 220, 221 operate, a protecting operation is performed by stopping a gate control signal which is supplied to the IGBT element 217 from the gate drive circuit 225 and at the same time a operation signal is supplied to the self holding circuit 227. In the fault detector 224, operations of these protecting circuits may be detected and a signal of the output signal terminal 271 of the self holding circuit 227 may be used. The self protecting circuit 227 self holds a protecting operation till the circuit 227 is reset by an input signal of the reset signal terminal 272 and a signal is also supplied to the gate drive circuit 225 during this self holding period.

Relations between operations of the overcurrent protecting circuit 220 as self protecting means associated with a current in the IGBT element 217 of FIG. 22 or the short-circuit current protecting circuit 221 and an operation of the self holding circuit are described in reference to FIGS. 23A to 23D and FIGS. 24A to 24C. FIGS. 23A shows a wave form diagram of a gate control signal supplied to the IGBT element 217 through the gate drive circuit 225, FIG. 23B shows a wave form diagram of a protection output control signal of the short-circuit current protecting circuit 221, FIG. 23C shows a wave form diagram of an output signal of the self holding circuit 227 and FIG. 23D shows a wave form of a reset signal supplied to the self holding circuit 227 from the reset signal terminal 272.

In FIGS. 23A to 23D, the IGBT element 217 normally operates by receiving a gate control signal till time t1, in accompany with an operation of the protecting circuit the self holding circuit 227 is actuated and continues self holding when the short-circuit current protecting circuit 221 is activated at time t1 and a reset signal is normally supplied from the reset signal terminal 272 to reset the self protecting circuit at time t2, so that a gate control signal is supplied to the IGBT element 217. In such a manner, the IPM 226 which is a semiconductor device shown in FIG. 22 can self-hold an operation of the self protecting circuit by the self holding circuit 227 till a reset signal is supplied from the outside of the IPM 226.

FIG. 24A is a wave form diagram of a gate control signal supplied to the IGBT element 217 through the gate drive circuit 225, FIG. 24B is a wave form diagram of a protection output signal of the short-circuit current protecting circuit 221 and FIG. 24C is a wave form of an output signal of the self holding circuit 227. In FIGS. 23A to 23C, the self holding circuit 227 starts a self holding operation in company of generation of protection output signal of the short-circuit protecting circuit 221, whereas in FIGS. 24A to 24C, the self holding circuit 227 starts at time t6 and continues the self holding after the number with generation times of a protection output signal reaches a predetermined number or a time interval in which a protection output signal is generated elapses a predetermined interval.

As shown in FIGS. 24A to 24C, IPM 226 of FIG. 22 only exerts self protection against a transitory erratic ignition of an IGBT element 217, for example, caused by a noise mixed into a gate control signal. IPM 226 of FIG. 22 activates the self holding circuit 227 against phenomena which happens after a time t6, and which should be countered by intrinsic self protection, such as degradation of an IGBT element 217 caused by repetition of a transitory erratic ignition, for example, and can continue a self holding operation till a reset signal is supplied from the outside of IPM 226.

An eleventh embodiment of the present invention will be described in reference to FIG. 25. IPM 226' which is a semiconductor device of FIG. 25 comprises: a gate derive circuit 228, a gate resistor 229 and an output signal terminal 273 of a self holding circuit in addition to the constituents shown in FIG. 22.

In IPM 226' of the embodiment, there is shown the case where four IGBT elements 217 each as a chip in a device package and four diodes are connected in parallel in an equivalent manner. While the number of chips connected in parallel in a package is not limited, the four IGBT elements 217 are accommodated and two of them and the other two thereof are respectively connected in parallel and supplied with a common gate signal from the gate drive circuits 228 through the gate resistors 229. Two sets of this combination are in parallel connected in the package in an equivalent manner and a parallel configuration of the four IGBT elements 217 is completed. For each unit of parallel connection controlled by a common gate drive circuits 228, the overcurrent protecting circuit (OCC) 220 and the short-circuit current protecting circuit (SCC) 221 are provided as a self protecting function associated with a current.

The number of chips in parallel connected in an equivalent manner is not specifically limited in a package of the semiconductor device, a self protecting function is provided for each predetermined parallel connection unit in which constituents are in parallel connected and thereby a self protecting operation can independently be conducted in each of degraded parallel connection units.

Figure 25:
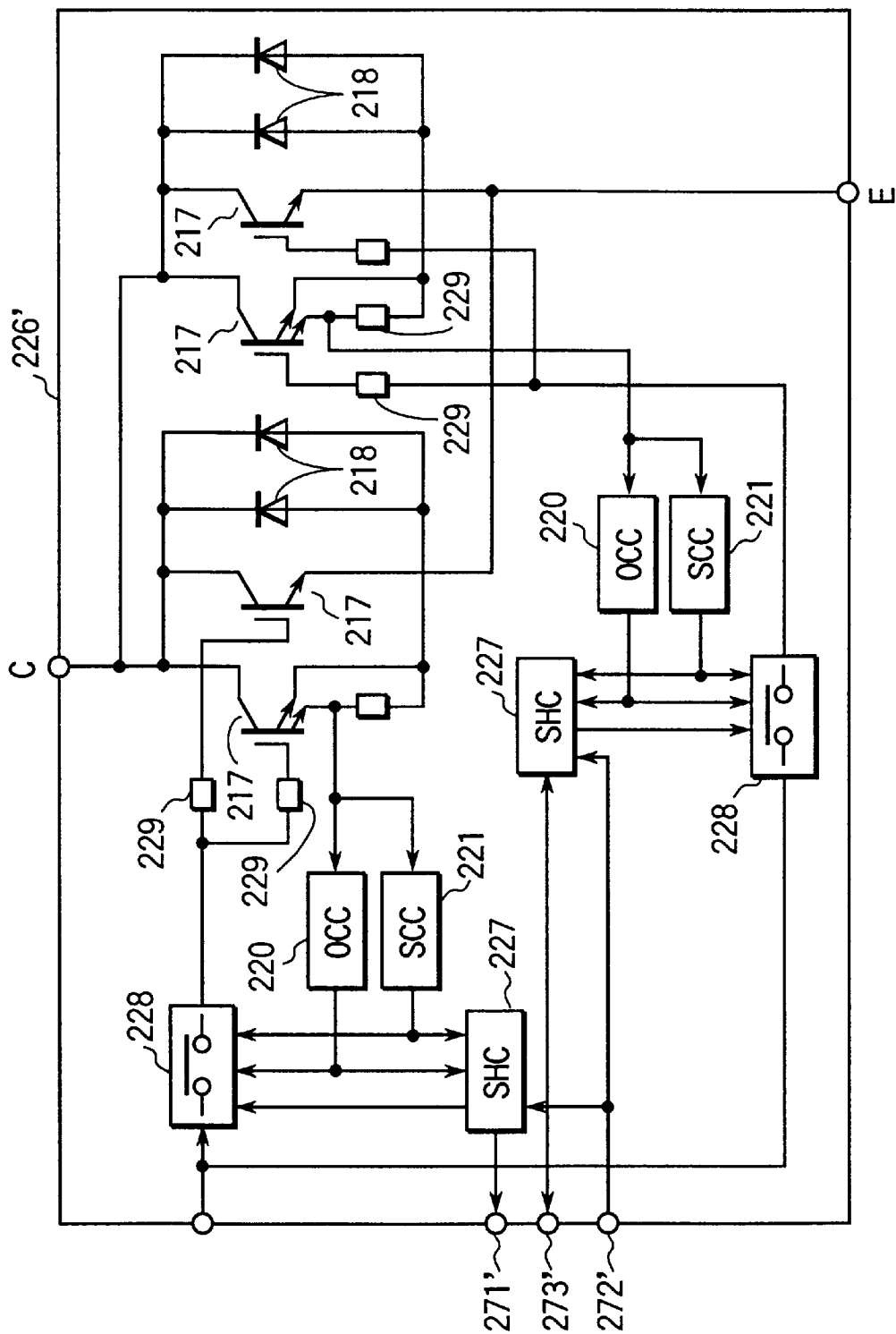
FIG. 25 is a block diagram showing an outline of a structure of a eleventh embodiment of the present invention.

As shown in FIG. 25, since the self holding circuit (SHC) 227 is provided for each parallel connection unit, a plurality of self holding circuits 227 are provided in the package and a probability at which all the chips in the package of the semiconductor device are degraded at the same time is lower, only the limited number of parallel connection units are brought in a self protecting mode and the other parallel connection units can continue a switching operation as a semiconductor device with supply of a gate control signal from the gate drive circuit 228 in a normal manner.

In such a manner, even while the IPM 226' continues its operation, an operational condition of the self holding circuit 227 can be discriminated by each of output signals from the output signal terminals 271, 273 of the self holding circuits 227.

In a semiconductor device of a MOS gate structure such as the IGBT element 217, the gate drive circuit 228 has a high possibility for the case where the gate terminal of the IGBT element 217 assumes a low input impedance due to degradation of the gate terminal of the IGBT element 217 which has conducted a self protecting operation. In such a manner, if the gate terminal has assumed a low impedance, a signal level on the input side of the gate drive circuit 228 is affected. Thereby gate control signals of other parallel connection units of IGBT elements 217 which have not conducted a self protecting operation can be reduced. In order to prevent such an influence from being exercised, a switching function can be provided in the gate drive circuit 228 so that a gate control signal is not supplied from the corresponding gate drive circuit 228 during a period the self holding circuit 227 of a parallel connection unit which has conducted a self protecting operation continues a self holding operation. Thereby a self holding operation can be made to continue without any external disturbance acting on a gate control signal of orderly parallel connection units or an orderly IPM 226' in parallel connected externally.

A parallel connection unit in which a gate control signal is not supplied by activating a switching function of the gate drive circuit 228 may be operated by the gate drive circuit 228 so that the gate terminal and the emitter terminal of the IGBT element 217 assumes a short-circuit condition in an equivalent manner only during when the gate control signal is not supplied.

Figure 26:
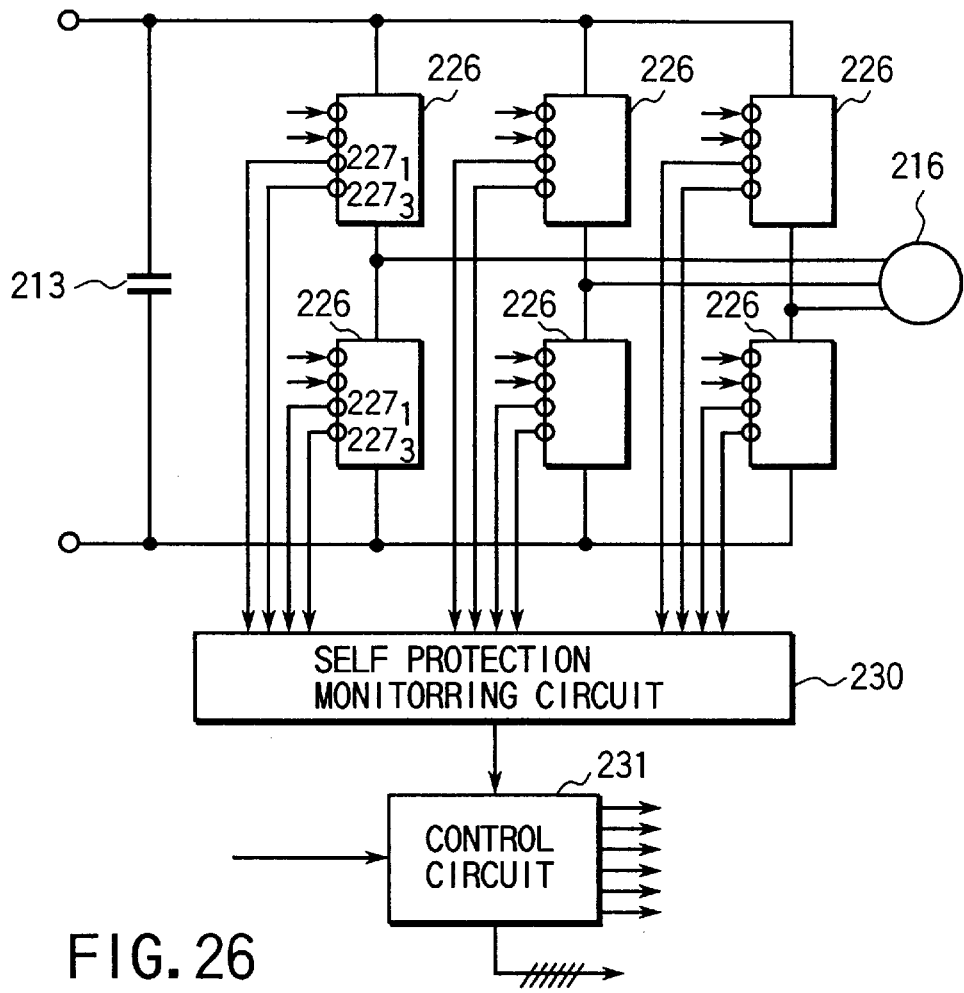
FIG. 26 is a block diagram showing an outline of a structure of a twelfth embodiment of the present invention.

A twelfth embodiment will be described in reference to FIG. 26. That is, FIG. 26 shows a circuit configuration in the case where IPM 226 which is a semiconductor device, as shown in FIG. 22 ( or the IPM 226' shown in FIG. 25) is adopted as a switching element of a power converter. In FIG. 26, the power converter comprises a self protection monitoring circuit 230 and a control circuit 231. When self protecting means is activated and thereby self holding means is activated in the inside of the IPM 226 shown in FIG. 22 (or the IPM 226' shown in FIG. 25), the self protection monitoring circuit 230 detects this and transmits the information to the control circuit 231.

However, since the control circuit 231 operates so that the control circuit 231 continues to supply a gate control signal to the IPM 226 in the scope of operation of predetermined holding means, the power converter using a semiconductor device can continue its operation.

Therefore, operational reliability of a power converter can be improved by a great margin, as compared with a conventional power converter which stops its operation immediately after only one chip is degraded.

A thirteenth embodiment of the present invention will be described in reference to FIG. 27. In a circuit shown in FIG. 27, three IPMs 226 (or three IPMs 226' shown in FIG. 25) which are semiconductor devices are in parallel connected. Parallel connection of the semiconductor devices can be made to operate as one switching element 215 in an equivalent manner.

Figure 27:
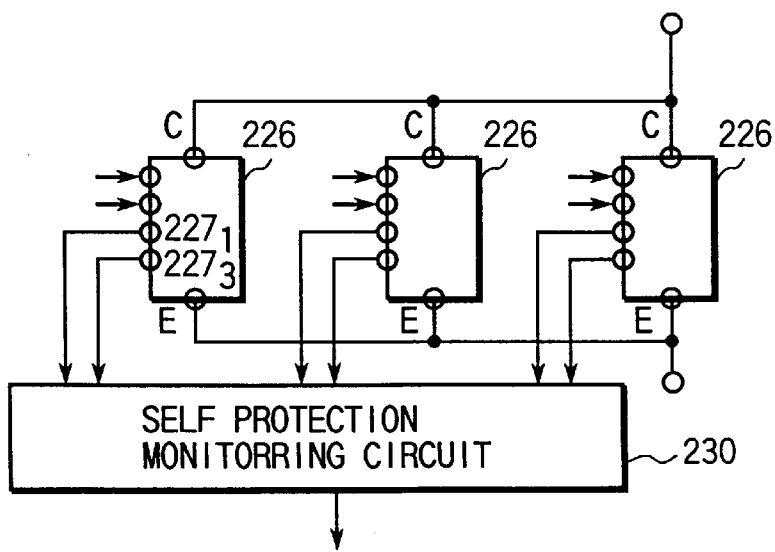
FIG. 27 is a block diagram showing an outline of a structure of a switching element of a power converter in a thirteenth embodiment of the present invention.

In the case where as shown in FIG. 27, the IPM 226 is in parallel connected and applied to as a switching element of the power converter as shown in FIG. 26, an operation of the power converter using the semiconductor devices can continue while monitoring an operational condition of self holding means, it is detected by the self protection monitoring circuit 230 if self protecting means in the inside of the IPMs 226 in parallel connection is activated.

In the self protection monitoring circuit 230, since an operational condition of the self holding means is monitored, the monitoring circuit 230 outputs a signal to the control circuit 231 in correspondence to an operational situation of the self holding means and thereby a current of the power converter is controlled. When a current of the power converter is controlled in correspondence to the operational situation of the self holding means, the power converter can be continued to operate while operational reliability is improved with a margin in terms of a magnitude of current since a current load on other IPMs 226 in parallel connected is reduced.

A fourteenth embodiment of the present invention will be described in reference to FIGS. 28A, 28B. FIG. 28A shows the number of self holding means which are in operation by six IPMs (switching elements) shown in FIG. 26. FIG. 28A shows a limited value of a current of the power converter. In FIGS. 28A, 28B, U and X, V and Y, and W and Z are combinations of two IPMs (switching elements) each in series connected with each other and inserted between direct current buses.

While there is no operation of the self holding leans till a time ta, after the time ta, the self holding monitoring circuit 230 discriminates the largest operational number of self holding functions in comparison among the three sets of IPMs (switching elements) in each set of which two IPMs are in parallel connected and a current of the power converter is controlled through the control circuit 231.

The limited value of a current is changed sequentially at ta, tb and tc and in FIG. 28, the operation of the power converter is terminated since a total number of the IPMs (switching element) having the same self holding functions amounts to four at a time td.

In such a manner, if the power converter is made to continue its operation under limitation of a current while it is discriminated in which circuit portion a self holding means is activated by the self holding monitoring circuit 230 by the IPMs (switching elements), operational reliability can greatly be improved, compared with a conventional power converter. That is, while a conventional power converter has stopped by even only one self holding means in operation, operational reliability of a power converter can be improved by a rate corresponding to a continuous operation till a total number of self holding means reaches nine in the embodiment.

A fifteenth embodiment of the present invention will be described in reference to FIGS. 29A to 29C. FIG. 29A shows the number of self holding means which are in operation by six IPMs (switching elements) shown in FIG. 26. FIG. 29B shows a limited value of a current of the power converter. FIG. 29C shows a signal input to a reset signal terminal 272 of IPM shown in FIG. 22 or FIG. 25.

While a operational situation of the self holding means is monitored by the self holding monitoring circuit 230 and a current of the power converter is limited at times ta and tb in a similar manner to in FIGS. 28A to 28B, a reset signal is input to a reset signal terminal 272 of the IPM 226, which is a semiconductor device, from a control circuit 231 at a time te. Since the reset signal is input to the reset signal terminal of the IPM 226 at the time te, an operation of the self holding means can be reset when the operation is not caused by a factor of the IPM itself but caused by a temporary factor on the load side. Thereby, if the self holding means can be reset, a limited value of a current of the power converter is changed after a time td when a reset signal is input and thus operational reliability of the power converter can be improved.

While in the above mentioned embodiments, IPM 226 using an IGBT element 217 is employed, kinds and the number are not limited to that. Kinds of self protecting means provided in a semiconductor device is not specifically limited, but any self protecting means can be used as far as it at least corresponds to a current factor and in addition the numbers of self protecting means and self holding means in a semiconductor device is also not restrictive. A power converter using a semiconductor device is not specifically limited in aspects of its circuit system or a restrictive method of its current.

As mentioned above, according to the present invention, a semiconductor device with which operational reliability can be improved and a power converter using the same can be provided.

In the third principle of the present invention, a signal cannot be supplied from the drive circuit to a predetermined chip during a period when self holding means in operation in company with a protecting operation of self protecting means.

At least when self protecting means is activated in a predetermined semiconductor device, self holding means corresponding to self protecting means which has been activated can be made to operate, while an operation is continued using a semiconductor device whose self protecting means is not activated.

There can be provided a monitor detecting means for monitoring and detecting self holding means and a variable control means for changing a limited level of a current according to a detection signal from the monitor detecting means.

A fourth principle of the present invention following the above mentioned concept will be described. The fourth principle has a voltage drive switching element as a feature. The device is a pressure-welded insulated-gate switching element and comprises: an electrode pressure-welded to the device; and an inductance element formed in the shape having features of a cylinder and a spiral, which is provided between an end of the element and the electrode.

According to the principle, a pressure-welded insulated-gate switching element which is preferably used as a voltage drive switching element adaptable for a power converter can be provide.

A sixteenth embodiment which is preferably used for a voltage drive switching element following the third principle will be described. The embodiment discloses a flat type IEGT and will be described in reference to FIGS. 30 to 32.

Figure 30:
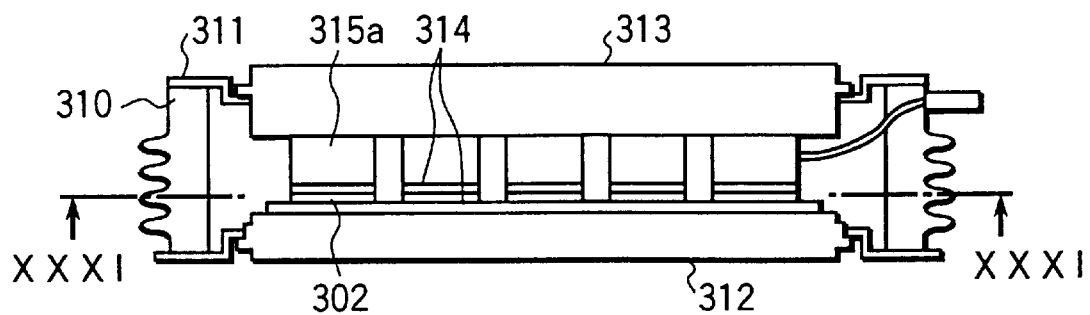
FIG. 30 is a view partially in section of a package of a flat type IEGT of a sixteenth embodiment of the present invention.
Figure 31:
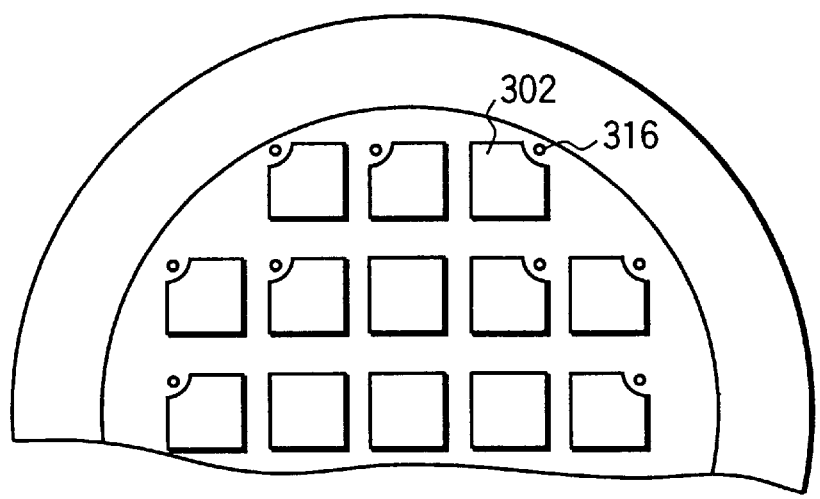
FIG. 31 is a sectional view taken on line XXXI—XXXI of FIG. 30.

FIG. 30 shows a view partially in section of a package of a flat type IEGT and a porcelain insulator 310 in the shape of a ring mounted with covers made of a metal plate 311 joined at the upper and lower ends and copper posts 312, 313 are further joined, which are used as collector and emitter electrodes, which are conductive members, and which can be subject to plastic deformation. A thermal buffer plates 314 made of molybdenum are inserted between the copper posts 312, 313 at both ends of a chip 2 constructed of a gate section and a collector and emitter section in order to suppress a thermal strain of the device caused by a current pass and plural chips in the shape of a quadrangular prism shown in FIG. 31 are inserted to produce a flat type IEGT. A copper coil 315$a$ as an inductance element is inserted between the copper post 313 which is to be an emitter electrode and the thermal buffer plate 314. A gate pin 316 is formed at an end of a predetermined chip 2.

Figure 32:
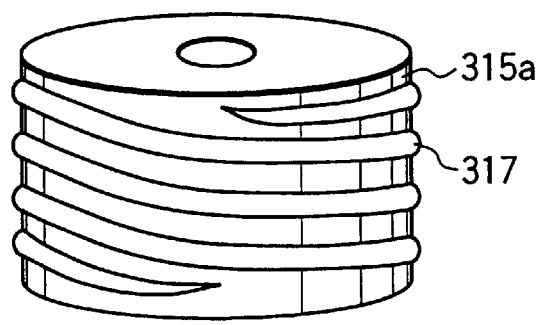
FIG. 32 is a perspective view of a coil in the shape of a cylinder shown in FIG.30.

As shown in FIG. 32, the coil 315$a$ is prepared by mechanical processing of a copper rod to the shape of a hollow cylinder and a groove in the shape of a spiral is cut in the side portion of the hollow cylinder and an insulating sheet 317 such as normex is embedded as insulation between coils.

In such a manner, since the coil 315a in the shape of a cylinder as an inductance element is used and a voltage E imparted between both ends of the coil 315a occurring in cut-off is less that 50V, a voltage applied to the insulating sheet 317 is a voltage which is a magnitude obtained by having the voltage E divided by the turn number of the coil 315a and thus no problem occurs in terms of dielectric strength.

A value of the coil 315a can be suppressed less than 50 nH. The reason why is that the limit of withstand voltage of the gate of the device is on the order of 50V and dielectric breakdown happens if a voltage larger than this value is applied.

In this structure, since a breaking current di/dt in a device under a high voltage is on the order of 1 kA/$\mu$ sec, L=E/(di/dt)=50V/1KA=50 nH. For example, Outer dimensions of the coil 315a at 25 nH with a safety factor of 2 is on the order of a diameter of 10 mm, the number of turns of 5 and a length of 6 mm.

Therefore, according to the embodiment, since a material of the coil 315a is copper, a pressure is applied to the copper posts 312, 313 and thereby the coil 315a is subject to plastic deformation, a dimensional error can be absorbed so as to secure uniform pressure given to chips.

In an aspect of characteristics, as is in the case of a device of a bonding type, when a current is cut off, a voltage L-di/dt occurs, and a gate voltage $V_{ge}$ actually applied to the device is not $E_{off}$ but reduced to $E_{off}$ −L·di/dt, and a turn-off voltage is alleviated. For this reason, a breaking phenomenon does not occur, thereby dv/di in turn-off is milder and a device breakdown can be prevented.

Moreover, when a larger current is cut off, dv/dt is further milder and a device breakdown is prevented with more ease since di/dt is further larger and in company with this a gate voltage for off is automatically is decreased.

According to the embodiment, since as in the case of a device of a bonding type, as a withstand voltage of a device is higher and thereby a voltage E is higher, di/dt which is a increasing rate of a current di/dv=E/L (where L indicates an inductance of an interconnection and the like) is in a reverse manner is smaller, it can be prevented that a current is concentrated in some devices and the devices are broken down if devices are connected in parallel.

A modified example of the inductance element shown in the embodiment will be described in reference to FIGS. 33 to 36.

The inductance element shown in FIG. 32 is a coil 315b in the shape of a quadrangular prism while the coil 315a is in the shape of a cylinder shown in FIG. 32. A current capacity can be increased since a sectional area for a current pass can be larger, as compared with the coil in the shape of a cylinder shown in FIG. 32.

In the case of the coil 315b in the shape of a quadrangular prism, as in the case of the coil in the shape of a cylinder, since it is required that a voltage is generally limited to be lower than a withstand voltage between the gate and emitter, a voltage E between both ends of the coil 315b occurring when a current is cut off is lower than 50V, Therefore a voltage applied to an insulating sheet 316 is a value which is obtained by having the voltage E divided by the turn number of the coil 315b and the voltage applied to the insulating sheet is a value having no problem in terms of a withstand voltage.

Figure 33:
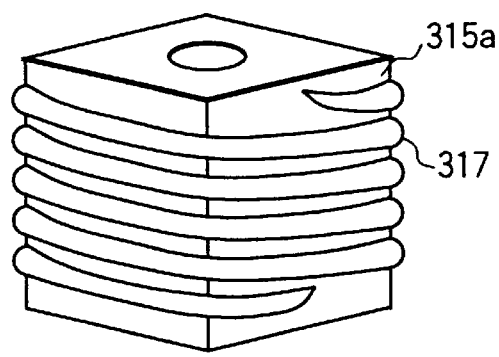
FIG. 33 is a perspective view of a coil in the shape of a quadrangular prism shown in FIG.30.
Figure 34:
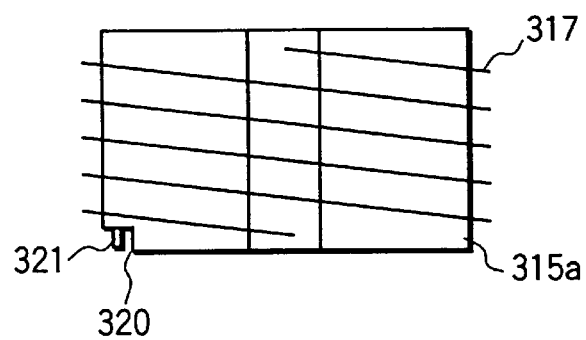
FIG. 34 is a sectional view along a central line of the coils shown in FIGS. 32 and 33.

FIG. 34 is a sectional view along a central line of the coil 315a in the shape of a cylinder shown in FIG. 32 and a sectional view along a central line of the coil 315b in the shape of a cylinder shown in FIG. 33. As shown in the figures, gate electrodes Eg of the coil 315a of FIG. 32 in the shape of a cylinder and the coil 315b of FIG. 33 in the shape of a quadrangular prism are formed each by inserting a gate pin 321 having a spring nature connected by a wire to a cut-off portion 320 formed at a lower portion or the coil 315b.

Figure 35:
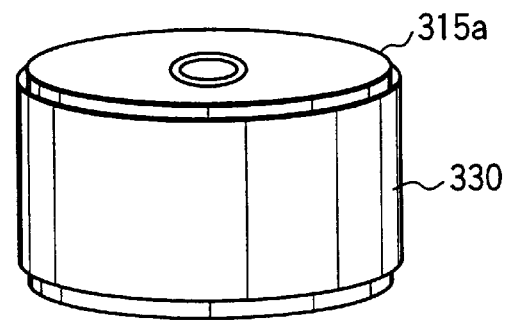
FIG. 35 is a perspective view of the coil in the shape of a cylinder shown in FIG. 30, which is applied with an insulating coating.

FIG. 35 shows the coil 315a in the shape of a cylinder applied with insulating coating 330 such as of epoxy. In this case, while the coil 315a in the shape of a cylinder is an object, a similar effect can be obtained if the coil 315b of FIG. 33 in the shape of quadrangular prism is applied with an insulating coating 330 such as of epoxy.

Figure 36:
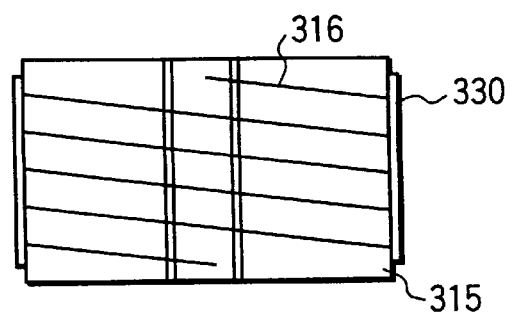
FIG. 36 is a sectional view along a central line of the coil shown in FIG. 35.

FIG. 36 is a sectional view along a central line of FIG. 35 and the insulating coating 330 is performed by a process in which the coil 315a which has mechanically been processed to form a spiral groove is first preheated, then subjected to a fluid dipping method and an electrostatic coating method, so that the groove in the shape of a spiral is insulated. The insulating coating 330 adhered at both ends of the coil 315a can mechanically removed to form an electrode. This insulating coating 330 has no problem as in the case of the insulating sheet 316 in terms of a withstand voltage.

Though it is not shown, in the case where the plural number of the coils 315a shown in FIG. 30 or the coils 315b shown in FIG. 33 are connected in parallel and a larger current capacity is desired, cooper spots 312, 313 which are to be the emitter electrodes and plural coils 315a in the shape of a cylinder or plural coils 315b in the shape of a quadrangular prism are arranged. As an arrangement of the plural coils, the coils 315a or 315b are respectively connected to the copper posts 313 which are the emitter electrodes by using silver solder or the coils 315a or 315b are respectively subjected to press working or casting in one body with the copper posts 313. Thereafter, a grooving processing in the shape of a spiral is conducted and then the insulating sheet 316 is inserted or the insulating coating 330 is embedded.

In a switching element following the fourth principle of the present invention is characterized in:

that in an insulated gate semiconductor element wherein the element and an electrode are pressure-welded, thermal buffer plates are provided at both end of the element and the element and the electrode, and the element and the inductance element can respectively be connected to each other with the thermal buffer plate interposing therebetween;

that spaces between turns of the inductance element can be subjected to an insulating treatment;

that the insulating treatment can be performed by inserting an electrically insulating material between turns of the inductance element;

that the insulating treatment can be performed by applying an electrically insulating coating between turns of the inductance element; and that plural inductance elements can in parallel be connected; and that the electrode and the plural inductance elements can be formed in one body.

As mentioned above, according to the present invention, since inductance elements can be pressure welded in a uniform manner in devices, there can be provided an insulated gate semiconductor element in which dv/dt can be alleviated and imbalance of a current in turn-off in the case of parallel connection can be suppressed, while a scale merit as a pressure-welled, insulated-gate semiconductor element is utilized.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A power converter having a voltage drive switching device comprising:

detecting means for detecting at least one of a set of device parameters and a set of electric parameters of the voltage drive switching device;

monitoring means for monitoring at least one of states of turn-on and turn-off of the voltage drive switching device based on the at least one of a set of device parameters and a set of electric parameters of the voltage drive switching device detected by the detecting means; and control means for controlling a gate of the voltage drive switching device based on a monitoring result of the monitoring means, wherein each of the detecting means and the monitoring means comprises deciding means for deciding completion of turnoff of the voltage drive switching device based on a gate voltage of the voltage drive switching device, and the control means comprises bias shift means for shifting a gate voltage of the voltage drive switching device to the negative side when the deciding means determines completion of turn-off of the voltage drive switching device.

2. The power converter according to claim 1, wherein the detecting means comprises a switching element which goes into an on-state and determines completion of turn-off of the voltage drive switching device when the gate voltage is less than a predetermined value.

3. The power converter according to claim 2, further comprising:

a second switching element which is in an on-state only when the voltage drive switching device is on, and goes into an off-state upon being applied with a gate voltage; and a gate resistor element which imparts a negative voltage to the gate of the voltage drive switching device from the second twitching element.

4. A power converter having a voltage drive switching device comprising:

detecting means for detecting at least one of a set of device parameters and a set of electric parameters of the voltage drive switching device;

monitoring means for monitoring at least one of states of turn-on and turn-off of the voltage drive switching device based on the at least one of a set of device parameters and a set of electric parameters of the voltage drive switching device detected by the detecting means; and control means for controlling a gate of the voltage drive switching device based on a monitoring result of the monitoring means, wherein the monitoring means comprises a switching element which goes into an on-state and determines completion of turn-off of the voltage device switching device when a higher one of a gate voltage and a voltage applied to a gate resistor element connected to the gate of the voltage drive switching device is lower than predetermined value.

5. The power converter according to claim, further comprising:

a second switching element, which is in an on-state when the first switching element is in an on-state; and a gate resistor element which imparts a negative voltage to the gate of the voltage drive switching device through the second switching element.

6. A power converter having a voltage drive switching device comprising:

detecting means for detecting at least one of a set of device parameters and a set of electric parameters of the voltage drive switching device;

monitoring means for monitoring at least one of states of turn-on and turn-off of the voltage drive switching device based on the at least one of a set of device parameters and a set of electric parameters of the voltage drive switching device detected by the detecting means;

control means for controlling a gate of the voltage drive switching device based on a monitoring result of the monitoring means; and self protecting means provided in parallel to the voltage drive switching device, for performing a protecting operation associated with a current flowing in the voltage drive switching device.

7. The power converter according to claim 6, wherein the gate further comprising:

reset means for resetting holding of a protecting operation of the self protecting means based on an external signal.

8. The power converter according to claim 6, further comprising:

reset means for resetting holding of a protecting operation of the self protecting means based on an internal signal in one of cases that protecting operation of the self protecting means is performed not more than a predetermined number of times and that consecutive protecting operations of the self protecting means are performed before a predetermined interval elapses, and based on an external signal in one of cases that protecting operation of the self protecting means is performed more than a predetermined number of times and that consecutive protecting operations of the self protecting means are performed after a predetermined interval elapses.

9. A power converter having at least a pair of voltage drive switching devices comprising;

detecting means for detecting at least one of a set of device parameters and a set of electric parameters of the pair of voltage drive switching devices;

monitoring means for monitoring at least one of states of turn-on and turn-off of the pair of voltage drive switching devices based on the at least one of a set of device parameters and a set of electric parameters of the pair of voltage drive switching devices detected by the detecting means; and control means for controlling a gate of the pair of voltage drive switching devices based on a monitoring result of the monitoring means, wherein the detecting means comprises means for detecting a current flowing in the pair of voltage drive switching devices; and each of the monitoring means and the control means comprises means for controlling a dead time between turn-off of one of the pair of voltage drive switching devices and supply of an on-gate signal to the other one of the pair of voltage drive switching devices, to decrease when the current detected by the determining means exceeds a predetermined value, and to increase when the current detected by the determining means is smaller than the predetermined value.

10. A power converter having at least a pair of voltage drive switching devices comprising:

detecting means for detecting at least one at a set of device parameters and a set of electric parameters of the pair of voltage drive switching devices;

monitoring means for monitoring at least one of states of turn-on and turn-off of the pair of voltage drive switching devices based on the at least one of a set of device parameters and a set of electric parameters of the pair of voltage drive switching devices detected by the detecting means; and control means for controlling a gate of the pair of voltage drive switching devices based on a monitoring result of the monitoring means, wherein the detecting means comprises polarity determining means for determining a polarity of a current flowing in the pair of voltage drive switching devices based on an output signal of the detecting means; and the control means comprises means for delaying supply of an on-gate signal to the pair of voltage drive switching devices for a predetermined period of time, based on a result by the polarity determining means, thereby increasing a dead time.

11. A power converter having at least a pair of voltage drive switching devices comprising:

detecting means for detecting at least one at a set of device parameters and a set of electric parameters of the pair of voltage drive switching devices;

monitoring means for monitoring at least one of states of turn-on and turn-off of the pair of voltage drive switching devices based on the at least one of a set of device parameters and a set of electric parameters of the pair of voltage drive switching devices detected by the detecting means; and control means for controlling a gate of the pair of voltage drive switching devices based on a monitoring result of the monitoring means, wherein the detecting means comprises a power supply current detector for detecting a current of a direct current power supply connected to the pair of voltage drive switching devices; and each of the monitoring means and the control means comprises means for controlling a dead time between turn-off of one of the pair of voltage drive switching devices and supply of an on-gate signal to the other one of the pair of voltage drive switching devices, to decrease when the current detected by the determining means exceeds a predetermined value, and to increase when the current detected by the determining means is smaller than the predetermined value.

12. A power converter having at least a pair of voltage drive switching devices comprising:

detecting means for detecting at least one of a set of device parameters and a set of electric parameters of the pair of voltage drive switching devices;

monitoring means for monitoring at least one of states of turn-on and turn-off of the pair of voltage drive switching devices based on the at least one of a set of device parameters and a set of electric parameters of the pair of voltage drive switching devices detected by the detecting means; and control means for controlling a gate of the pair of voltage drive switching devices based on a monitoring result of the monitoring means, wherein the detecting means comprises an alternating current power detector for detecting an alternating current power of the pair of voltage drive switching devices; and each of the monitoring means and the control means comprises means for controlling a dead time between turn-off of one of the pair of voltage drive switching devices and supply of an on-gate signal to the other one of the pair of voltage drive switching devices, to decrease when the current detected by the determining means exceeds a predetermined value, and to increase when the current detected by the determining means is smaller than the predetermined value.

13. A power converter having at least a pair of voltage drive switching devices comprising:

detecting means for detecting at least one of a set of device parameters and a set of electric parameters of the pair of voltage drive switching devices;

monitoring means for monitoring at least one of states of turn-on and turn-off of the pair of voltage drive switching devices based on the at least one of a set of device parameters and a set of electric parameters of the pair of voltage drive switching devices detected by the detecting means; and control means for controlling a gate of the pair of voltage drive switching devices based on a monitoring result of the monitoring means, wherein the detecting means comprises negative bias voltage detecting means for detecting a state that an absolute value of a gate negative bias voltage of the pair of voltage drive switching devices exceeds a predetermined value; and each of the monitoring means and the control means comprises means for supplying an on-gate signal to one of the pair of voltage drive switching devices based on a conjugation of an output signal of the negative bias voltage detecting means and an on-gate signal of the other one of the pair of voltage drive switching devices which is an object for detection by one negative bias voltage detecting means.

14. A power converter having at least a pair of voltage drive switching devices comprising;

detecting means for detecting at least one of a set of device parameters and a set of electric parameters of the pair of voltage drive switching devices;

monitoring means for monitoring at least one of states of turn-on and turn-off of the pair of voltage drive switching devices based on the at least one of set of device parameters and a set of electric parameters of the pair of voltage drive switching devices detected by the detecting means; and control means for controlling a gate of the pair of voltage drive switching devices based on a monitoring result of the monitoring means, wherein the detecting means comprises gate current detecting means for detecting when a negative gate current of the pair of voltage drive switching devices exceeds a predetermined value; and each of the monitoring means and the control means comprises means for supplying a gate signal to one of the pair of voltage drive switching devices based on conjugation of an output signal of the gate current detecting means and an on-gate signal of the other one of the pair of voltage drive switching devices which is an object for detection by the negative bias voltage detecting means.

15. A power converter having a voltage drive switching device comprising:

detecting means for detecting at least one of a set of device parameters and a set of electric parameters of the voltage drive switching device;

monitoring means for monitoring at least one of states of turn-on and turn-off of the voltage drive switching device based on the at least one of a set of device parameters and a set of electric parameters of the voltage drive switching device detected by the detecting means;

control means for controlling a gate of the voltage drive switching device based on a monitoring result of the monitoring means;

self protecting means for performing a protecting operation associated with a current flowing in the voltage drive switching device;

self holding means for holding a protecting operation when the self protecting means is activated; and reset means for resetting holding of a protecting operation of the self protecting means based on an external signal.

16. A power converter having a voltage drive switching device comprising:

detecting means for detecting at least one of a set of device parameters and a set of electric parameters of the voltage drive switching device;

monitoring means for monitoring at least one of states of turn-on and turn-off of the voltage drive switching device based on the at least one of a set of device parameters and a set of electric parameters of the voltage drive switching device detected by the detecting means;

control means for controlling a gate of the voltage drive switching device based on a monitoring result of the monitoring means;

self protecting means for performing a protecting operation associated with a current flowing in the voltage drive switching device;

self holding means for holding a protecting operation when the self protecting means is activated; and reset means for resetting holding of a protecting operation of the self protecting means based on an internal signal in one of cases that protecting operation of the self protecting means is performed not more than a predetermined number of times and that consecutive protecting operations of the self protecting means are performed before a predetermined interval elapses, and based on an external signal in one of cases that protecting operation of the self protecting means is performed more than a predetermined number of times and that consecutive protecting operations of the self protecting means are performed after a predetermined interval elapses.

17. A power converter having a voltage drive switching device comprising:

detecting means for detecting at least one of a set of device parameters and a set of electric parameters of the voltage drive switching device;

monitoring means for monitoring at least one of states of turn-on and turn-off of the voltage drive switching device based on the at least one of a set of device parameters and a set of electric parameters of the voltage drive switching device detected by the detecting means; and control means for controlling a gate of the voltage drive switching device based on a monitoring result of the monitoring means, wherein the voltage drive switching device includes:

an electrode pressure-welded to the voltage drive switching device; and an inductance element formed in a shape having features of a cylinder and a spiral, and provided between an end of the voltage switching device and the electrode.

18. A power converter having a voltage drive switching device comprising:

detecting means for detecting at least one of a set of device parameters and a set of electric parameters of the voltage drive switching device;

monitoring means for monitoring at least one of states of turn-on and turn-off of the voltage drive switching device based on the at least one of a set of device parameters and a set of electric parameters of the voltage drive switching device detected by the detecting means; and control means for controlling a gate of the voltage drive switching device based on a monitoring result of the monitoring means, wherein the voltage drive switching device includes;

an electrode pressure-welded to the voltage drive switching device; and an inductance element formed in a shape having features of a quadrangular prism and a spiral, and provided between an end of the voltage switching device and the electrode.

19. A power converter having a voltage drive witching device comprising:

detecting means for detecting at least one of a set of device parameters and a set of electric parameters of the voltage drive switching device;

monitoring means for monitoring at least one of states of turn-on and turn-off of the voltage drive switching device based on the at least one of a set of device parameters and a set of electric parameters of the voltage drive switching device detected by the detecting means; and control means for controlling a gate of the voltage drive switching device based on a monitoring result of the monitoring means, wherein the voltage drive switching device includes:

an electrode pressure-welded to the voltage drive switching device; and an inductance element formed in a spiral shape, and provided between an end of the voltage switching device and the electrode.

* * * * *